(12) United States Patent
Hyun et al.

(10) Patent No.: US 11,379,009 B2
(45) Date of Patent: Jul. 5, 2022

(54) ELECTRONIC DEVICE HAVING CONDUCTIVE EXTERIOR MEMBER AND METHOD FOR DETECTING LEAK CURRENT REGARDING SAME

(71) Applicant: Samsung Electronics Co., Ltd, Suwon-si (KR)

(72) Inventors: Jiseob Hyun, Gumi-si (KR); Jicheng Zheng, Guangzhou (KR); Beom-Mun Kim, Busan (KR); Seung-Hun Kim, Gumi-si (KR); Choel-Hwi Kwon, Daegu (KR); Jaehyung Seo, Daegu (KR); Yongmin Shin, Daegu (KR); Hyun-Suk Choi, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 317 days.

(21) Appl. No.: 16/641,218

(22) PCT Filed: Aug. 21, 2018

(86) PCT No.: PCT/KR2018/009576
§ 371 (c)(1),
(2) Date: Feb. 21, 2020

(87) PCT Pub. No.: WO2019/039825
PCT Pub. Date: Feb. 28, 2019

(65) Prior Publication Data
US 2020/0225295 A1 Jul. 16, 2020

(30) Foreign Application Priority Data
Aug. 22, 2017 (KR) ........................ 10-2017-0105966

(51) Int. Cl.
*G01R 31/52* (2020.01)
*G06F 1/16* (2006.01)
(Continued)

(52) U.S. Cl.
CPC ........... *G06F 1/1656* (2013.01); *G01R 31/52* (2020.01); *G01R 31/56* (2020.01); *G06F 1/1658* (2013.01);
(Continued)

(58) Field of Classification Search
CPC ..... G06F 1/1656; G06F 1/1658; G01R 31/56; G01R 31/52; H01R 12/73; H01R 12/79;
(Continued)

(56) References Cited

U.S. PATENT DOCUMENTS

2012/0146863 A1 6/2012 Kwon
2016/0049720 A1 2/2016 Hwang et al.
(Continued)

FOREIGN PATENT DOCUMENTS

JP 2012-146822 A 8/2012
KR 10-0650906 B1 11/2006
(Continued)

OTHER PUBLICATIONS

International Search Report dated Nov. 27, 2018 in connection with International Patent Application No. PCT/KR2018/009576, 2 pages.
(Continued)

*Primary Examiner* — Mandeep S Buttar

(57) ABSTRACT

An electronic device according to an embodiment of the disclosure may include a housing including a front plate, a back plate disposed to the opposite side of the front plate, and a side member surrounding a space between the front plate and the back plate, wherein at least a part of the back plate is constructed of a conductive material, and the side member includes an opening, a touch screen display disposed between the front plate and the back plate, a female connector disposed inside the opening, constructed to house a meal connector an external male connector, and including a plurality of pins, a Printed Circuit Board (PCB) disposed
(Continued)

inside the space and including a ground plane, a circuit electrically coupled to the ground plane and/or mounted thereon to cut off leak current from the PCB, a first conductive path constructed between the circuit and a first point of at least part of the back plate, and a second conductive path constructed between at least one of the pins and a second point of at least part of the back plate. In addition, various other embodiments are also possible.

20 Claims, 27 Drawing Sheets

(51) Int. Cl.
    *G01R 31/56*     (2020.01)
    *H01R 12/73*     (2011.01)
    *H01R 12/79*     (2011.01)
    *H01R 13/648*     (2006.01)
    *H05K 5/00*     (2006.01)
    *H05K 5/04*     (2006.01)

(52) U.S. Cl.
    CPC .............. *H01R 12/73* (2013.01); *H01R 12/79* (2013.01); *H01R 13/648* (2013.01); *H05K 5/0017* (2013.01); *H05K 5/04* (2013.01)

(58) Field of Classification Search
    CPC ................ H01R 13/648; H01R 13/658; H01R 13/6581; H01R 13/6585; H01R 12/722; H05K 5/0017; H05K 1/028; H05K 2201/0311; H05K 2201/042; H05K 1/05; H05K 1/148; H05K 1/147; H05K 1/189; H05K 2201/05; H05K 5/04; H05K 5/0069; H05K 3/361
    USPC ......... 361/736, 816, 749, 748, 42, 719, 753, 361/799, 818, 679.55, 679.56, 679.01, 361/679.03, 752, 800; 439/638, 76.1
    See application file for complete search history.

(56) References Cited

U.S. PATENT DOCUMENTS

| 2017/0033797 A1 | 2/2017 | Jung et al. |
| 2017/0170562 A1 | 6/2017 | Lee et al. |
| 2018/0007817 A1* | 1/2018 | Ryu ..................... G06F 1/1656 |

FOREIGN PATENT DOCUMENTS

| KR | 10-2017-0015017 A | 2/2017 |
| KR | 10-2017-0071200 A | 6/2017 |
| KR | 10-2017-0077618 A | 7/2017 |

OTHER PUBLICATIONS

Written Opinion of the International Searching Authority dated Nov. 27, 2018 in connection with International Patent Application No. PCT/KR2018/009576, 3 pages.

* cited by examiner

ELECTRONIC DEVICE HAVING CONDUCTIVE EXTERIOR MEMBER AND METHOD FOR DETECTING LEAK CURRENT REGARDING SAME

CROSS-REFERENCE TO RELATED APPLICATIONS

This application is a 371 of International Application No. PCT/KR2018/009576 filed on Aug. 21, 2018, which claims priority to Korean Patent Application No. 10-2017-0105966 filed on Aug. 22, 2017, the disclosures of which are herein incorporated by reference in their entirety.

1. FIELD

Various embodiments of the disclosure relate to a method of detecting and preventing leakage current in an electronic device having a conductive exterior member.

2. DESCRIPTION OF RELATED ART

With the development of digital technologies, electronic devices are provided in various forms, such as a smart phone, a tablet Personal Computer (PC), a Personal Digital Assistant (PDA), or the like. The electronic device is also developed such that it is worn by a user to improve portability and user accessibility.

The electronic device may include a housing constituting at least part of an exterior. An electronic device to which a metallic housing is applied may provide a metal-specific luxurious design, compared to an electronic device to which a plastic housing is applied. In addition, since a metallic material applied to the housing also has effect on durability, the electronic device to which the metallic housing is applied is becoming more popular.

In an electronic device having a conductive exterior member (e.g., metal), current may be leaked to the conductive exterior member. The current leaked to the conductive exterior member flows to a human body of a user who carries the electronic device, and the current passing through the human body may cause reactions (or symptoms) of the human body. Unintended high-voltage Alternating Current (AC) current may be supplied from an external power device to the electronic device due to a defect or breakage of an external device (e.g., a charging device) for charging a battery of the electronic device. For another example, unintended Direct Current (DC) over-current output from the electronic device may be leaked to the conductive exterior member. Although the conductive exterior member may be designed to include an insulating material coated on a surface thereof, when the conductive exterior member is aged or broken, leakage current may flow from the conductive exterior member to the human body.

The electronic device may include elements for preventing the current from being leaked to the conductive exterior member. In order to test whether the elements normally operate, an external test device may be coupled to a Printed Circuit Board (PCB) on which the elements are mounted. The external test device may apply impact (or pressure) to the PCB during the test process, which may lead to a damage on the PCB. In addition, when the conductive exterior member is designed as an element which is difficulty detached from the electronic device, it may be difficult to couple the external test device to the PCB of the electronic device which is a final product.

Various embodiments of the disclosure may provide an apparatus supporting for easy detection of current leaked to a conductive exterior member of an electronic device, the electronic device including the apparatus, and a method of detecting the leakage current.

Various embodiments of the disclosure may provide an apparatus designed such that an external test device can be coupled to a leakage current cutoff circuit of an electronic device without having to detach the conductive exterior member from the electronic device, the electronic device including the apparatus, and a method of detecting the leakage current.

SUMMARY

An electronic device according to an embodiment of the disclosure may include a housing including a front plate, a back plate disposed to the opposite side of the front plate, and a side member surrounding a space between the front plate and the back plate, wherein at least a part of the back plate is constructed of a conductive material, and the side member includes an opening, a touch screen display disposed between the front plate and the back plate, a female connector disposed inside the opening, constructed to house a meal connector an external male connector, and including a plurality of pins, a Printed Circuit Board (PCB) disposed inside the space and including a ground plane, a circuit electrically coupled to the ground plane and/or mounted thereon to cut off leak current from the PCB, a first conductive path constructed between the circuit and a first point of at least part of the back plate, and a second conductive path constructed between at least one of the pins and a second point of at least part of the back plate.

According to an embodiment of the disclosure, an electronic device may include a housing including a front plate, a back plate disposed to the opposite side of the front plate, and a side member surrounding a space between the front plate and the back plate, wherein at least a part of the back plate is constructed of a conductive material, and the side member includes an opening, a touch screen display disposed between the front plate and the back plate, a PCB disposed inside the space and including a ground plane, a first circuit electrically coupled to the ground plane and/or mounted thereon to cut off leak current from the PCB, a conductive path constructed between the first circuit and a first point of at least part of the back plate, a second circuit electrically coupled with the ground plane and a second point of at least part of the back plate to detect leakage current which flows from the PCB to the back plate, a female connector disposed inside the opening, constructed to house an external male connector, and including a plurality of pins, and a processor electrically coupled with the second circuit and the female connector. The process may transmit intensity of leakage current detected by the second circuit to the male connector connected to the female connector.

According to various embodiments of the disclosure, a method of detecting leakage current cutoff performance for an electronic device having a conductive exterior member may include detecting current leaked through a Universal Serial Bus (USB) connector of the electronic device, and recognizing that performance for cutting off current leaked to the conductive exterior member is in a deterioration state if the detected current exceeds a threshold.

Various embodiments of the disclosure can easily detect whether leakage current cutoff performance of an electronic device deteriorates, by connecting an external electronic device to a connector prepared to an exterior of the electronic device. According to various embodiments, whether a leakage current cutoff circuit of the electronic device deteriorates can be detected without having to detach the conductive exterior member from the electronic device.

DETAILED DESCRIPTION

Figure 1:
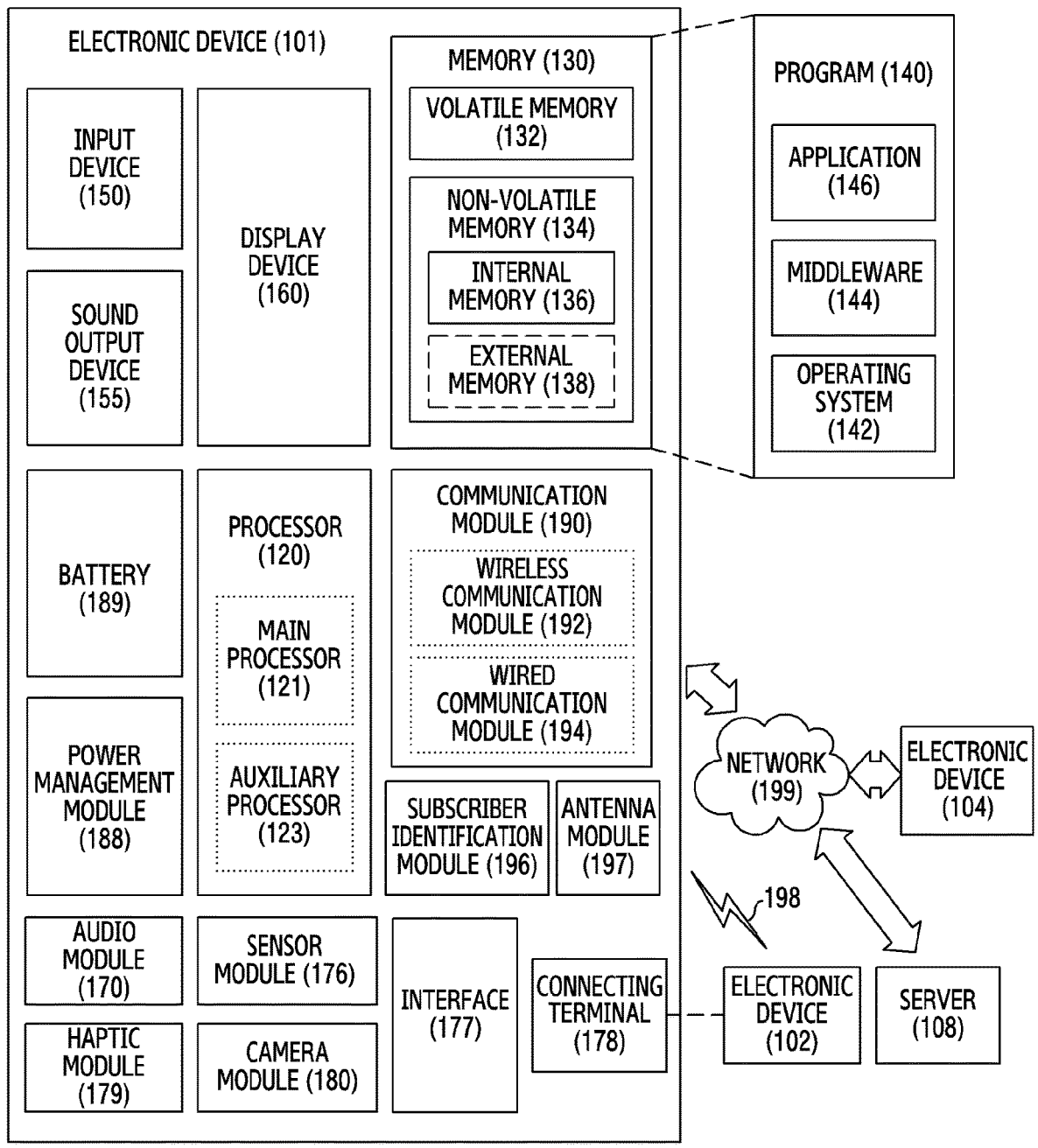
FIG. 1 is a block diagram of an electronic device in a network environment according to various embodiments.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements. A singular expression includes a plural concept unless there is a contextually distinctive difference therebetween. In the disclosure, an expression "A or B", "A and/or B", or the like may include all possible combinations of items enumerated together. Although expressions such as "1st", "2nd", "first", and "second" may be used to express corresponding components, it is not intended to limit the corresponding components. When a certain (e.g., 1st) component is mentioned as being "operatively or communicatively coupled with/to" or "connected to" a different (e.g., 2nd) component, the certain component is directly coupled with/to another component or can be coupled with/to the different component via another (e.g., 3rd) component.

An expression "configured to" used in the present document may be interchangeably used with, for example, "suitable for", "having the capacity to", "adapted to", "made to", "capable of", or "designed to" in a hardware or software manner according to a situation. In a certain situation, an expressed "a device configured to" may imply that the device is "capable of" together with other devices or components. For example, "a processor configured to perform A, B, and C" may imply a dedicated processor (e.g., an embedded processor) for performing a corresponding operation or a generic-purpose processor (e.g., Central Processing Unit (CPU) or an application processor) capable of performing corresponding operations by executing one or more software programs stored in a memory device.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

In various embodiments, the wearable device may include at least one of an accessory-type device (e.g., a watch, a ring, a bracelet, an anklet, a necklace, glasses, contact lenses, or a Head-Mounted Device (HMD)), a fabric- or clothes-integrated device (e.g., electronic clothes), a body attaching-type device (e.g., a skin pad or tattoo), or a body implantable device (e.g., an implantable circuit). According to some embodiments, the electronic device may include, for example, at least one of a TeleVision (TV), a Digital Video Disk (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™, PlayStation™), an electronic dictionary, an electronic key, a camcorder, and an electronic picture frame.

According to various embodiments, the electronic device may include at least one of various medical devices (e.g., various portable medical measuring devices (e.g., a blood sugar measuring device, a heart rate measuring device, a blood pressure measuring device, a body temperature measuring device, etc.), Magnetic Resonance Angiography (MRA), Magnetic Resonance Imaging (MRI), Computed Tomography (CT), imaging equipment, ultrasonic instrument, etc.)), a navigation device, a Global Positioning System (GPS) receiver, an Event Data Recorder (EDR), a Flight Data Recorder (FDR), a car infotainment device, an electronic equipment for ship (e.g., a vessel navigation device, a gyro compass, etc.), avionics, a security device, a car head unit, an industrial or domestic robot, a drone, an Automatic Teller's Machine (ATM) of financial institutions, Point Of Sales (POS) of shops, and internet of things (e.g., a light bulb, various sensors, an electric or gas meter, a sprinkler device, a fire alarm, a thermostat, a streetlamp, a toaster, a fitness equipment, a hot water tank, a heater, a boiler, etc.). According to some embodiments, the electronic device may include at least one of part of furniture, buildings/constructions or cars, an electronic board, an electronic signature receiving device, a projector, and various measurement machines (e.g., water supply, electricity, gas, propagation measurement machine, etc.). The electronic device according to various embodiments may be flexible, or may be a combination of two or more of the aforementioned various devices. The electronic device according to an embodiment of the present document is not limited to the aforementioned devices. The term 'user' used in the present document may refer to a person who uses the electronic device or a device (e.g., an Artificial Intelligence (AI) electronic device) which uses the electronic device.

FIG. 1 is a block diagram of an electronic device in a network environment according to various embodiments.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108.

According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a Subscriber Identification Module (SIM) 196, or an antenna module 197. In some embodiments, at least one (e.g., the display device 160 or the camera module 180) of the components may be omitted from the electronic device 101, or one or more other components may be added in the electronic device 101. In some embodiments, for example, some of the components may be implemented integrally, such as the sensor module 176 (e.g., a fingerprint sensor, an iris sensor, or an illuminance sensor) embedded, for example, in the display device 160 (e.g., a touch screen display).

The processor 120 may drive, for example, software (e.g., a program 140) to control at least one other component (e.g., a hardware or software component) of the electronic device 101 coupled with the processor 120, and may perform various data processing or computation. The processor 120 may load and process a command or data received from another component (e.g., the sensor module 176 or the communication module 190) into a volatile memory 132, and store resulting data in a non-volatile memory 134. According to an embodiment, the processor 120 may include a main processor 121 (e.g., a Central Processing Unit (CPU) or an Application Processor (AP)), and an auxiliary processor 123 (e.g., a Graphics Processing Unit (GPU), an Image Signal Processor (ISP), a sensor hub processor, or a Communication Processor (CP)) that is operable independently from the main processor 121 or, additionally or alternatively, adapted to consume less power than the main processor 121 or to be specific to a specified function. Herein, the auxiliary processor 123 may be operable separately from or embedded to the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data, e.g., software (e.g., the program 140), and input data or output data for a command related thereto, used by at least one component (e.g., the processor 120 or the sensor module 176) of the electronic device 101. The memory 130 may include the volatile memory 132 or the non-volatile memory 134.

The program 140 may include, for example, an Operating System (OS) 142, middleware 144, or an application 146, as software stored in the memory 130.

The input device 150 is a device for receiving a command or data to be used by components (e.g., the processor 120) of the electronic device 101 from the outside (e.g., a user) of the electronic device 101, and may include, for example, a microphone, a mouse, or a keyboard.

The sound output device 155 is a device which outputs sound signals to the outside of the electronic device 101, and may include, for example, a speaker be used for general purposes, such as playing multimedia or playing record or a receiver used for an incoming calls. According to an embodiment, the receiver may be implemented integrally with or separately from the speaker.

The display device 160 is a device which provides information to the user of the electronic device 101, and may include, for example, a display, a hologram device, or a projector, and a control circuitry for controlling a corresponding device. According to an embodiment, the display device 160 may include a touch circuitry or a pressure sensor capable of measuring intensity of pressure incurred by a touch.

The audio module 170 may convert a sound into an electrical signal and vice versa. According to an embodiment, the audio module 170 may obtain the sound via the input device 150, or output the sound via the sound output device 155 or an external electronic device 102 (e.g., a speaker or a headphone) wiredly or wirelessly coupled with the electronic device 101.

The sensor module 176 may detect an operational state (e.g., power or temperature) of the electronic device 101, or may generate an electrical signal or data value corresponding to an external environment state. The sensor module 176 may include, for example, at least one of a gesture sensor, a gyro sensor, an atmospheric pressure sensor, a magnetic sensor, an acceleration sensor, a grip sensor, a proximity sensor, a color sensor (e.g., a Red, Green, Blue (RGB) sensor), an InfraRed (IR) sensor, a biometric sensor, a temperature sensor, a humidity sensor, and an illuminance sensor, and an Ultra Violet (UV) sensor. According to various embodiments, the sensor module 176 may include, for example, an E-nose sensor, an ElectroMyoGraphy (EMG) sensor, an ElectroEncephaloGram (EEG) sensor, an ElectroCardioGram (ECG) sensor, an Infrared (IR) sensor, an iris sensor, or a fingerprint sensor. The sensor module 176 may further include a control circuit for controlling one or more sensors included therein. In some embodiments, the electronic device 101 may further include a processor configured to control the sensor module 176 either separately or as a part of the processor 120, and may control the sensor module 176 while the processor is in a sleep state.

The interface 177 may support a specified protocol that can be wiredly or wirelessly coupled with the external electronic device 102. According to an embodiment, the interface 177 may include a High Definition Multimedia Interface (HDMI), a Universal Serial Bus (USB) interface, a Secure Digital (SD) card interface, or an audio interface.

A connecting terminal 178 may include a connector, via which the electronic device 101 can be physically coupled with the electronic device 101, for example, an HDMI connector, a USB connector, an SD card connector, or an audio connector (e.g., a headphone connector). In some embodiments, the connecting terminal 178 may include at least one contact (e.g., a conductive pad) disposed to an outer face of the electronic device 101. According to an embodiment, the external electronic device 102 (e.g., a tester) may be coupled to the connecting terminal 178, and may detect leakage current cutoff performance of the electronic device 101. According to an embodiment, although not shown, the electronic device 101 may include a leakage current cutoff circuit (or a leakage current reduction circuit) electrically coupled with a ground plane and a conductive exterior member. For example, the leakage current cutoff circuit may not be allowed to flow from the ground plane to the conductive exterior member.

According to an embodiment, the leakage current cutoff circuit may be designed to convert high-voltage Alternating Current (AC) input from the external electronic device 102 to low-voltage AC or remove it. According to another embodiment, the leakage current cutoff circuit may be designed to convert high-current AC input from the external electronic device 102 to low-current AC or remove it. In some embodiments, the leakage current cutoff circuit may be designed to convert high-current AC input from the external electronic device 102 to low-current DC or remove it. In some embodiments, the leakage current cutoff circuit may be designed to convert high-voltage AC input from the external electronic device 102 to low-current DC or remove it.

For example, if there is a deterioration in leakage current cutoff performance (e.g., a breakage in the leakage current cutoff circuit), current may flow from the ground plane to the conductive exterior member, which may electrically shock a user who carries the electronic device 101. According to an embodiment, the electronic device 101 may couple at least one first terminal of the connecting terminal 178 to the ground plane and couple at least one second terminal of the connecting terminal 179 to the conductive exterior member, and may provide a device which couples between the ground plane and the conductive exterior member to the leakage current cutoff circuit. According to various embodiments, the leakage current cutoff performance of the electronic device 101 may be easily detected by coupling the external electronic device 102 to the connecting terminal 178.

The haptic module 179 may convert an electrical signal into a mechanical stimulus (e.g., a vibration or a movement) or electrical stimulus which may be recognized by a user via tactile sensation or kinesthetic sensation. The haptic module 179 may include, for example, a motor, a piezoelectric element, or an electric stimulator.

The camera module 180 may capture a still image or a moving image. According to an embodiment, the camera module 180 may include one or more lenses, image sensors, image signal processors, or flashes.

The power management module 188 is a module for managing power supplied to the electronic device 101, and may be implemented, for example, as at least part of a Power Management Integrated Circuit (PMIC). The electronic device 101 may receive power supplied from an external power device (e.g., a charging device) coupled to the connecting terminal 178. In an embodiment, the electronic device 101 may include a leakage current cutoff circuit, and may convert high-voltage AC current input from an external power device (e.g., the external electronic device 102) into low-voltage DC current, thereby decreasing a risk of electric shock. For example, the leakage current cutoff circuit may be designed to be included in the PMIC.

The battery 189 is a device which supplies power to at least one component of the electronic device 101, and may include, for example, a primary cell which is not rechargeable, a secondary cell which is rechargeable, or a fuel cell.

The communication module 190 may support establishing a wired or wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the Application Processor (AP)) and support wired communication or wireless communication. According to an embodiment, the communication module 190 may include a wireless communication module 192 or a wired communication module 194, and by using a corresponding communication module between the communication modules, may communicate with an external electronic device via a first network 198 (e.g., a short-range communication network such as Bluetooth, WiFi direct, or Infrared Data Association (IrDA)) or a second network 199 (e.g., a long-distance communication network such as LAN or WAN). The aforementioned several types of communication modules 190 may be implemented as one chip or may be implemented individually as separate chips.

According to various embodiments, the wireless communication module 192 may include a cellular communication module, a short-distance wireless communication module, a Global Navigation Satellite System (GNSS) communication module, or the like. For example, the cellular communication module may use, for example, at least one of LTE, LTE Advance (LTE-A), code division multiple access (CDMA), Wideband CDMA (WCDMA), Universal Mobile Telecommunications System (UMTS), Wireless Broadband (WiBro), Global System for Mobile Communications (GSM), and the like. For example, the short-distance wireless communication module may include at least one of Wireless Fidelity (WiFi), Light Fidelity (LiFi), Bluetooth, Bluetooth Low Energy (BLE), Zigbee, Near Field Communication (NFC), magnetic secure transmission, Radio Frequency (RF), Body Area Network (BAN), and the like. For example, the GNSS communication module may be, for example, a Global Positioning System (GPS), a Global Navigation Satellite System (Glonass), a Beidou Navigation Satellite System (Beidou) or Galileo, the European global satellite-based navigation system.

According to various embodiments, the wired communication module 194 may include, for example, at least one of Universal Serial Bus (USB), High Definition Multimedia Interface (HDMI), Recommended Standard-232 (RS-232), power-line communication, Plain Old Telephone Service (POTS), and the like. The wired communication module 194 may include at least one of a telecommunications network, e.g., a computer network (e.g., LAN or WAN), the Internet, and a telephone network.

According to an embodiment, the wireless communication module 192 may use user information stored in the SIM 196 to identify or authenticate the electronic device 101 in the communication network.

The antenna module 197 may include one or more antennas to transmit or receive a signal or power to or from the outside. According to an embodiment, the communication module 190 (e.g., the wireless communication module 192) may transmit the signal to the external electronic device via an antenna suitable for a communication scheme, or may receive the signal from the external electronic device.

At least some of the above-described components may be coupled mutually and communicate signals (e.g., commands or data) therebetween via an inter-peripheral communication scheme (e.g., a bus, General Purpose Input and Output (GPIO), Serial Peripheral Interface (SPI), or Mobile Industry Processor Interface (MIPI)).

According to an embodiment, commands or data may be transmitted or received between the electronic device 101 and the external electronic device 104 via the server 108 coupled with the second network 199. Each of the external electronic devices 102 and 104 may be a device of the same type as, or a different type from, the electronic device 101. According to an embodiment, all or some of operations to be executed in the electronic device 101 may be executed in one or more of the external electronic devices. According to an embodiment, if the electronic device 101 has to perform a function or a service automatically, or in response to a request, the electronic device 101, instead of, or in addition to, executing the function or the service, may request the external electronic device to perform at least part of the function associated therewith. The external electronic device receiving the request may perform the requested function or the additional function, and may transfer an outcome of the performing to the electronic device 101. The electronic device 101 may provide the requested function or service, with or without further processing of the received outcome. To this end, for example, a cloud computing, distributed computing, or client-server computing technology may be used.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be configured as an Application-Specific Integrated Circuit (ASIC).

Various embodiments of the disclosure may be implemented as software (e.g., the program 140) including instructions stored in a machine (e.g., computer)-readable storage medium (e.g., an internal memory 136 or an external memory 138). The machine is a device which is capable of invoking an instruction stored in the storage medium and is operable according to the invoked instruction, and may include an electronic device (e.g., the electronic device 101) according to the disclosed embodiments. When the instruction is executed by a processor (e.g., the processor 120), the processor may execute a function corresponding to the instruction, with or without using other components under the control of the processor. The instruction may include a code generated or executed by a complier or an interpreter. The machine-readable storage medium may be provided in the form of a non-transitory storage medium. Herein, the term "non-transitory" simply means that the storage medium is a tangible device, and does not include a signal, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., Compact Disc Read Only Memory (CD-ROM)), or be distributed (e.g., downloaded or uploaded) online via an application store (e.g., Play Store™). If distributed online, at least part of the computer program product may be temporarily generated or at least temporarily stored in the machine-readable storage medium, such as memory of the manufacturer's server, a server of the application store, or a relay server.

Each component (e.g., a module or a program) according to various embodiments may be configured as a single entity or multiple entities. Among the aforementioned sub components, some of the sub components may be omitted, or some of other components may be further included in the various embodiments. Alternatively or additionally, some components (e.g., modules or programs) may be integrated into a single entity, so that functions are performed in the same or similar manner as they are performed by the respective corresponding components before the integration. According to various embodiments, operations performed by the module, the program, or another component may be carried out sequentially, in parallel, repeatedly, or heuristically, or one or more of the operations may be executed in a different order or omitted, or other operations may be added.

Figure 2A:
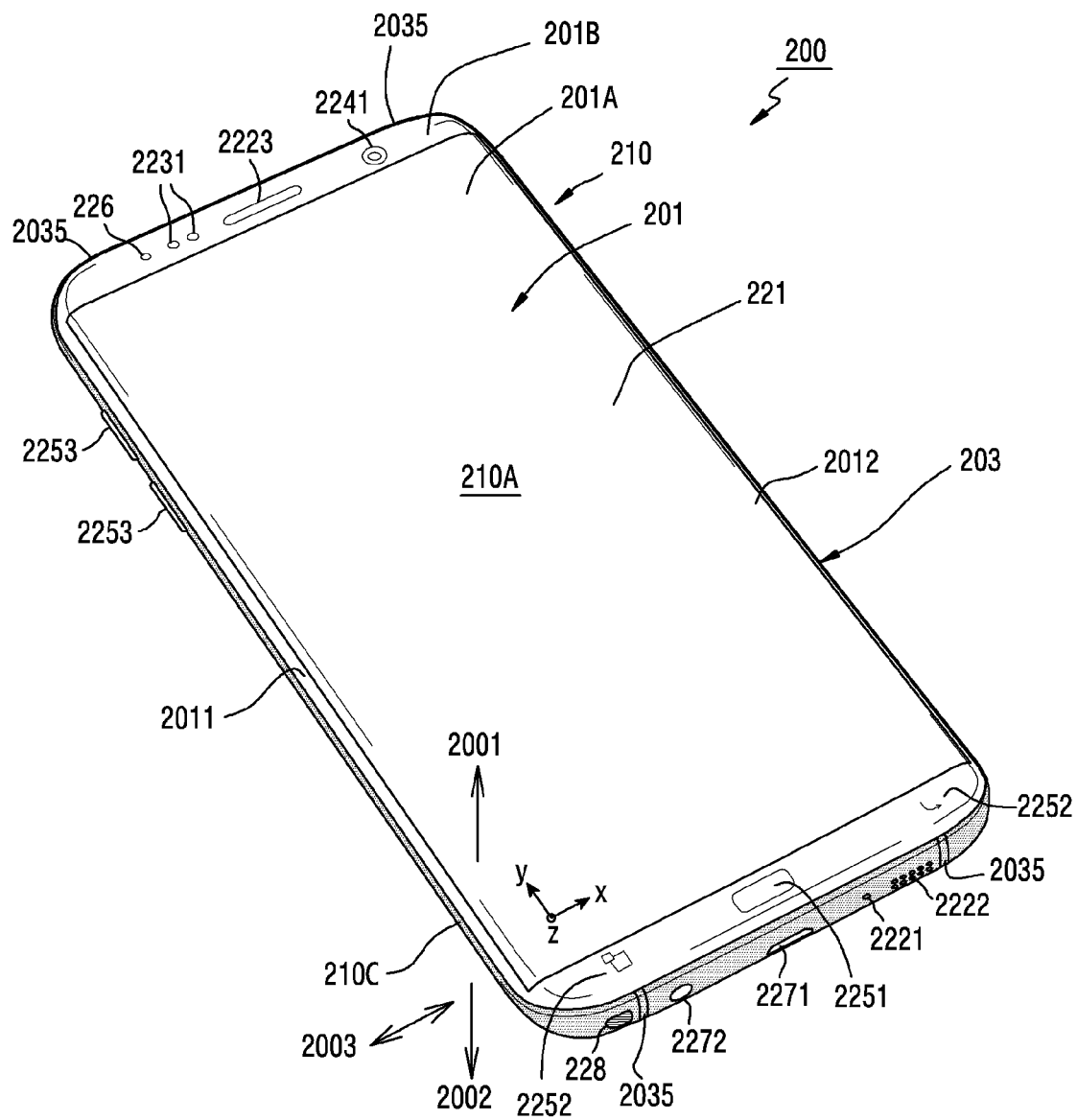
FIG. 2A is a front perspective view of an electronic device having a conductive exterior member according to an embodiment.
Figure 2B:
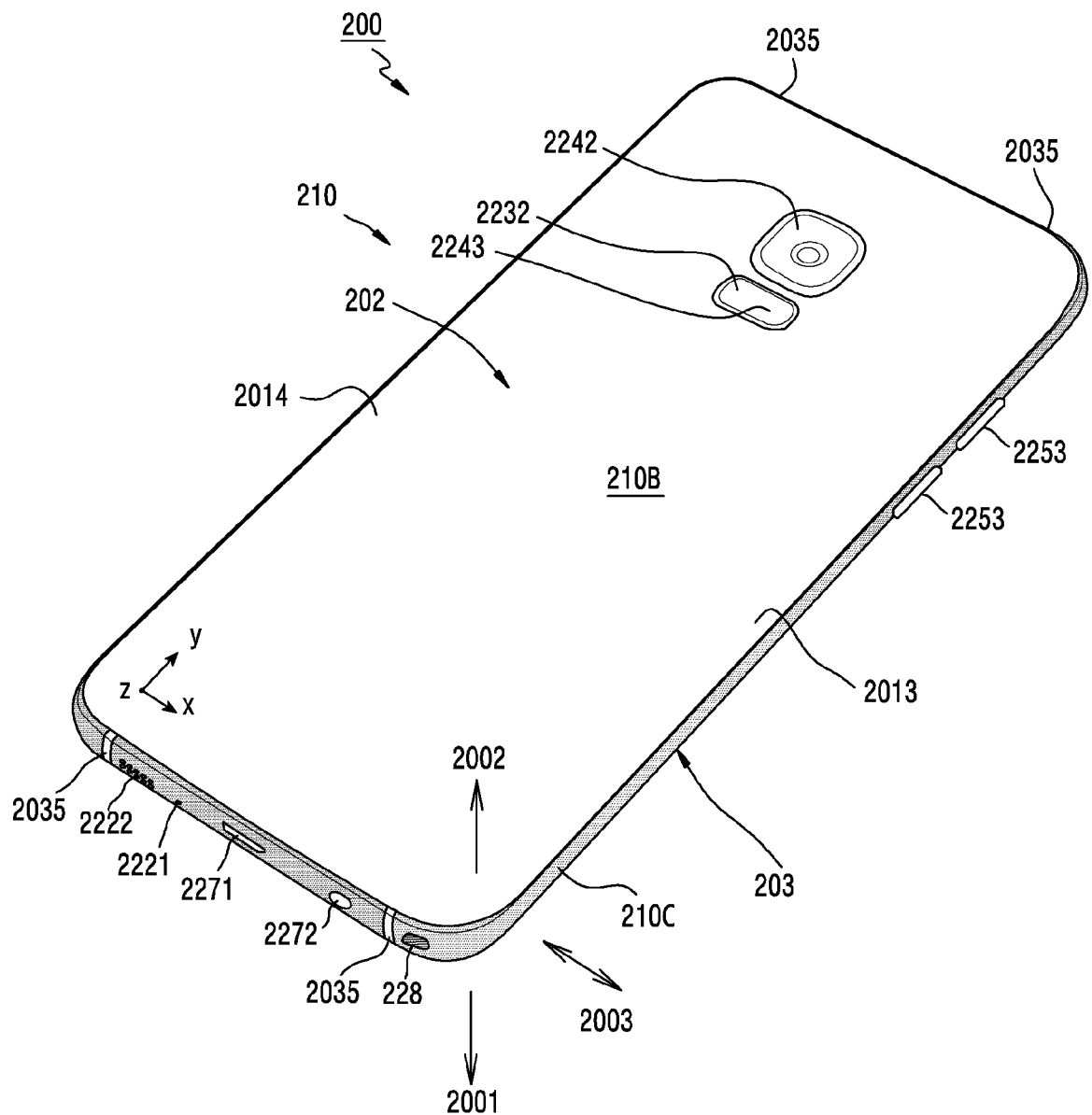
FIG. 2B is a rear perspective view of an electronic device having a conductive exterior member according to an embodiment.
Figure 3:
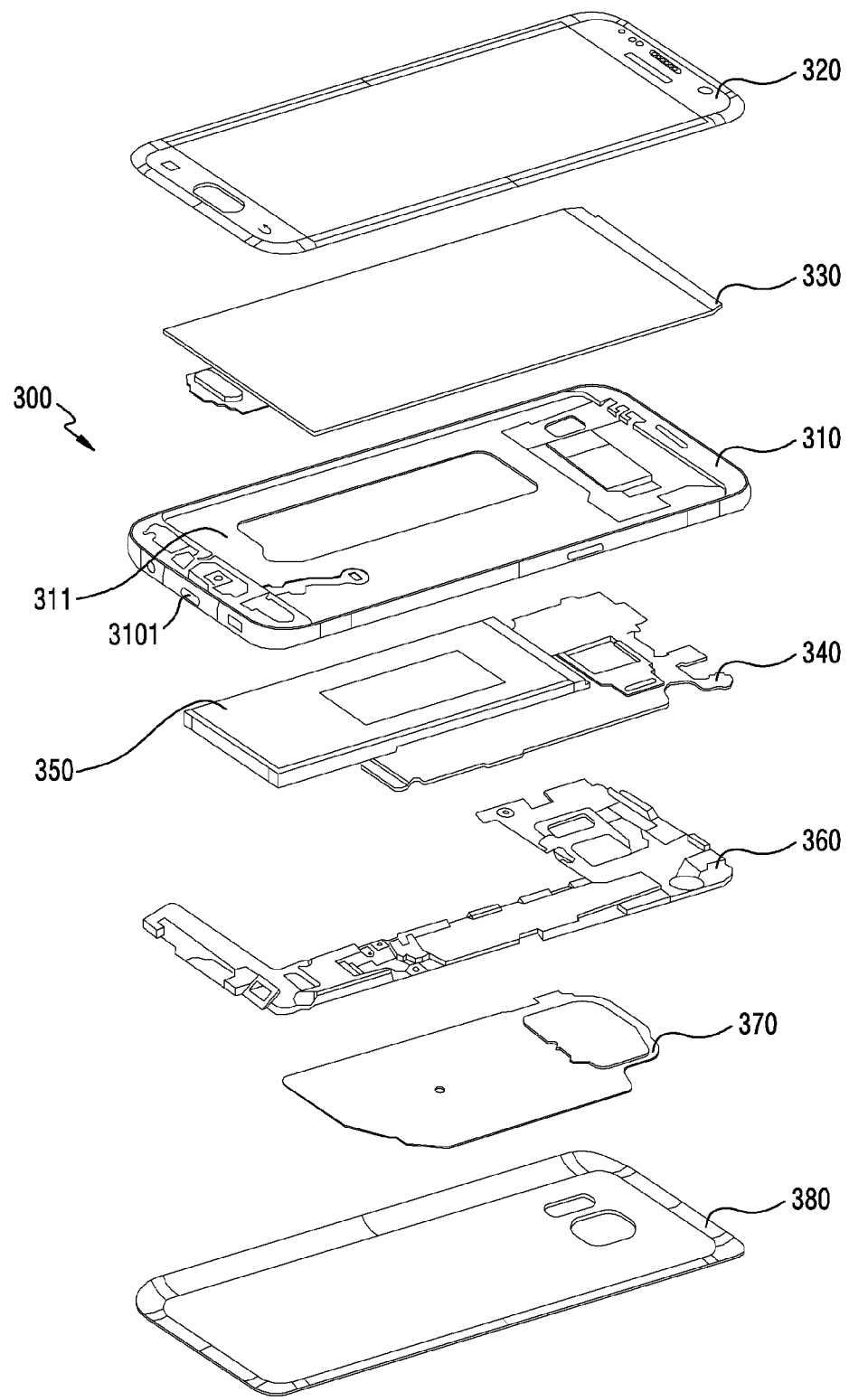
FIG. 3 is an exploded perspective view of an electronic device having a conductive exterior member according to an embodiment.

FIG. 2A is a front perspective view of an electronic device having a conductive exterior member according to an embodiment. FIG. 2B is a rear perspective view of an electronic device having a conductive exterior member according to an embodiment. FIG. 3 is an exploded perspective view of an electronic device having a conductive exterior member according to an embodiment.

An electronic device 200 of FIG. 2A and FIG. 2B may be, for example, the electronic device 101 of FIG. 1. Referring to FIG. 2A and FIG. 2B, the electronic device 100 according to an embodiment may include a housing 210 constituting the entirety or at least part of an exterior of the electronic device 200. The housing 210 may include a non-metallic material and/or a metallic material. For example, the housing 210 may be constructed of materials such as plastic, metal, carbon fiber and other fiber composites, ceramic, glass, wood, or combinations of these materials. According to various embodiments, the housing 210 may be constructed of one material as a whole or combinations of a plurality of materials. According to an embodiment, at least part of the housing 210 may be designed to have a metallic material, or may construct an exterior of the electronic device 200.

According to an embodiment, the housing 210 may construct an exterior including a first face (or a front face) 210A, a second face (or a back face) 210B, and a third face 210C. The first face 210A may face a first direction 2001, and the second face 210B may face a second direction 2002 opposite to the first direction 2001. The third face 210C may be a side face surrounding a space between the first face 210A and the second face 210B. According to another embodiment, although not shown, the housing 210 may refer to a structure of constructing at least part of the first face 210A, second face 210B, and third face 210C.

According to an embodiment, the housing 210 may include a cover or plate (hereinafter, a front plate) 201 constituting the first face (hereinafter, the front face) 210A. According to an embodiment, the front face 210A may be constructed by the front plate 201 (e.g., a glass plate or polymer plate including a plurality of coating layers) which is at least partially transparent in practice.

According to an embodiment, the housing 210 may include a cover or plate (hereinafter, a back plate) 220 constituting the second face (hereinafter, the back face) 210B. According to an embodiment, the back face 210B may be constructed by the back plate 202 which is opaque in practice. The back plate 202 may be constructed by coated or colored glass, ceramic, polymer, metallic materials (e.g. aluminum, stainless steel (STS), or magnesium) or a combination of at least two of the these materials. According to various embodiments, the back plate 202 may be molded in various manners such as die-casting, stamping (press), CNC, or the like, and at least part thereof may include a metallic material.

According to an embodiment, the housing 210 may include a side member (or a side bezel structure) 203 surrounding a space between the front plate 201 and the back plate 202. The side member 203 may be joined with the front plate 201 and the back plate 202, and the third face (hereinafter, the side face) 210C may be constructed by the side member 203. At least part of the side member 203 may be constructed of various materials such as metal, polymer, or the like.

According to various embodiments, an edge area of the front face 210A may be designed as an inclined face (e.g., a curved face). For example, at least one of both edge areas 2011 and 2012 of the front face 210A disposed in a unilateral direction 2003 may be an inclined face. According to an embodiment, the front face 201 may be designed to have a curved portion for constructing the inclined face of the front face 201A.

According to various embodiments, an edge area of the back face 210B may be designed as an inclined face (e.g., a curved face). For example, at least one of both edge areas 2013 and 2014 of the back face 210B disposed in the unilateral direction 2003 may be an inclined face. According to an embodiment, the back plate 202 may be designed to have a curved portion for constructing an inclined face of the back face 210B.

According to various embodiments, although not shown, the electronic device 200 may include a member (e.g., a mid-plate) extended between the front plate 201 and the back plate 202 from the side member 203.

According to an embodiment, at least part of the side member 203 may include a conductive material. According to various embodiments, the side member 203 may include a plurality of metallic portions physically separated from each other. According to an embodiment, a non-conductive member 2035 may be disposed between the plurality of metallic portions. According to various embodiments, the non-conductive member 2035 may be extended from a member (e.g., the mid-plate) disposed inside the electronic device 200.

According to various embodiments, the back plate 202 and the side member 203 may be designed integrally. For example, when the back plate 202 and the side member 203 are designed integrally, a construction may have a shape including a bottom constructed of the back plate 202 and a side wall constructed of the side member 203. When this construction is joined with the front plate 201, a space in which various elements (e.g., a display) are disposed may be constructed.

According to various embodiments, when the back plate 202 and the side member 203 are designed integrally, the back plate 202 and the side member 203 may include the same material (e.g., a metallic material such as aluminum, stainless steel).

The electronic device 200 may include, for example, various elements disposed between the front plate 201 and the back plate 202. According to an embodiment, the electronic device 200 may include at least one of a display 221, audio modules 2221, 2222, and 2223, sensor modules 2231 and 2232, camera modules 2241, 2242, and 2243, key input devices 2251, 2252, and 2253, an indicator 226, connector holes 2271 and 2272, and an electronic pen 228. In some embodiments, the electronic device 200 may omit at least one (e.g., key input devices 2251, 2252, and 2253) of the components or may additionally include other components.

The display 221 may be disposed, for example, along at least part of the front plate 201, and may be exposed through the front plate 201. The front plate 201 may include an area (hereinafter, a screen area) 201A which covers the display 221 and an area (hereinafter, a bezel area) 201B which does not cover the display 221. The screen area 201A may be substantially rectangular, and the bezel area 201B may have a shape of a rectangular ring surrounding the screen area 201A. The screen area 201A may be a substantially transparent area (e.g., an area having a light transmittance of at least about 50%), and light generated from the display 221 may be emitted to the outside through the screen area 201A. The bezel area 201B may be a substantially opaque area (e.g., a light blocking area). For example, the bezel area 201B may include a layer including a light blocking material. For example, the bezel area 201B may be designed to have color similar to or the same as the side member 203.

According to various embodiments, the display 221 may be disposed to be joined with or adjacent to a touch sensing circuit, a pressure sensor capable of measuring touch strength (pressure), and/or a pen sensor (or a digitizer) for detecting a magnetic-type electronic pen.

According to an embodiment, the audio modules 2221, 2222, and 2223 may include the microphone hole 2221 and the speaker holes 2222 and 2223. The microphone hole 2221 may have a microphone disposed inside thereof to acquire external sound, and in some embodiments, may have a plurality of microphones disposed to sense a sound direction. The speaker holes 2222 and 2223 may include the external speaker hole 2222 and the communication receiver hole 2223. In some embodiments, the speaker holes 2222 and 2223 and the microphone hole 2221 may be implemented with one hole, or the speaker may be included without the speaker holes 2222 and 2223 (e.g., a Piezo speaker).

According to an embodiment, the sensor modules 2231 and 2232 may generate an electrical signal or data value corresponding to an internal operational state of the electronic device 200 or an external environmental state. The sensor modules 2231 and 2232 may include, for example, the first sensor module 2231 (e.g., a proximity sensor) and/or second sensor module (not shown) (e.g., a fingerprint sensor) disposed to the front face 210A, and/or the third sensor module 2232 (e.g., a Heart Rate Monitoring (HRM) sensor) disposed to the back face 210B. The fingerprint sensor may be disposed not only to the front face 210A (e.g., the home key button 2251) but also the second face 210B. The electronic device 100 may further include at least one of sensor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor.

According to an embodiment, the camera modules 2241, 2242, and 2243 may include the first camera device 2241 disposed to the front face 210A of the electronic device 200, the second camera device 2242 disposed to the second face 210B, and/or the flash 2243. The camera modules 2241, 2242, and 2243 may include one or more lenses, an image sensor, and/or an image signal processor. The flash 2243 may include, for example, a Light Emitting Diode (LED) or a xenon lamp. In some embodiments, two or more lenses (wide angle and telephoto lenses) and image sensors may be disposed to one face of the electronic device 200.

According to an embodiment, the key input devices 2251, 2252, and 2253 may include a home key button 2251 disposed to the front face 210A, a touch pad 2252 disposed around home key button 2252, and a side key button 2253 disposed to the side face 210C. In another embodiment, the electronic device 200 may not include all or some of the aforementioned key input devices 2251, 2252, and 2253. The key input devices 2251, 2252, and 2253 which are not included may be implemented on the display 221 in a different form such as a soft key or the like.

The indicator 226 may be disposed, for example, to the front face 210A. The indicator 226 may provide, for example, state information of the electronic device 200 in an optical form, and may include an LED.

The connector holes 2271 and 2272 may include, for example, the first connector hole 2271 capable of housing a connector (e.g., a USB connector) for transmitting/receiving power and/or data of an external electronic device (e.g., 102 of FIG. 1) and/or the second connector hole (e.g., earphone jack) 2272 capable of housing a connector for transmitting/receiving an audio signal with respect to the external electronic device (e.g., 102 of FIG. 1). According to an embodiment, an external electronic device (e.g., 102 of FIG. 1) may be coupled to a connector (e.g., the connecting terminal 178 of FIG. 1), and may detect leakage current cutoff performance of the electronic device 200. According to an embodiment, although not shown, the electronic device 200 may include a leakage current cutoff circuit electrically coupled with a ground plane (e.g., a ground of a PCB) and a conductive exterior member (e.g., the back plate 202 or the side member 203). For example, the leakage current cutoff circuit may prevent current from flowing from the ground plane to the conductive exterior member. If there is a deterioration in leakage current cutoff performance (e.g., a breakage in the leakage current cutoff circuit), current may flow from the ground plane to the conductive exterior member, which may electrically shock a user who carries the electronic device 101. According to an embodiment, the electronic device 200 may couple at least one first terminal (or pin) of a connector (e.g., the connecting terminal 178 of FIG. 1) to the ground plane and couple at least one second terminal of the connector to the conductive exterior member, and may provide a device which couples between the ground plane and the conductive exterior member to the leakage current cutoff circuit. According to various embodiments, leakage current cutoff performance of the electronic device 200 may be easily detected by coupling an external electronic device (e.g., 102 of FIG. 1) to the connector.

According to various embodiments, the electronic device 200 may include a power management circuit electrically coupled with the ground plane (e.g., a PCB ground) and the conductive exterior member (e.g., the back plate 202). For example, the power management circuit may be the power management module 188 (e.g., PMIC) of FIG. 1. According to an embodiment, the power management circuit may obtain information on leakage current cutoff performance (or information on leakage current) (e.g., a magnitude of leakage current), and may provide this to a processor (e.g., 120 of FIG. 1). In an embodiment, the processor may output the obtained information on leakage current cutoff performance via a display (e.g., the display device 160 of FIG. 1). In another embodiment, the processor may transmit the obtained information on leakage current cutoff performance to an external electronic device (e.g., 102 of FIG. 1). The external electronic device (e.g., an external test device) may detect the leakage current cutoff performance of the electronic device 200 on the basis of the magnitude of leakage current transmitted from the electronic device 200.

The electronic pen 228 may be inserted into the housing 210, for example, through a hole (not shown) constructed on the side face 210C or may be detached to the outside of the housing 210. The electronic device 200 may include a device (e.g., a sensor) for sensing attachment/detachment of the electronic pen 228.

According to various embodiments, the electronic device 200 may further include various elements (or modules) depending on a type of providing it. The components may be modified in various manners along with the convergence trend of digital devices, and thus not all of the components may be listed herein. However, components of the same level as that of the aforementioned components may be further included in the electronic device 200. In the electronic device 200 according to various embodiments, it is apparent that specific components may be excluded from the aforementioned components or replaced with other components.

Referring to FIG. 3, an electronic device 300 may include a first support member 300 consisting of a side bezel structure 310 (e.g., the side member 203 of FIG. 2A or 2B), a first support member 311 (e.g., a bracket), a front plate 320 (e.g., 201 of FIG. 2A), a display 330 (e.g., the display device 160 of FIG. 1 or 221 of FIG. 2A), a Printed Circuit Board (PCB) 340, a battery 350 (e.g., 189 of FIG. 1), a second support member 360 (e.g., a rear case), an antenna 370 (e.g., the antenna module 197 of FIG. 1), and a back plate 380 (e.g., 202 of FIG. 2B). In some embodiments, the electronic device 300 may omit at least one of these components (e.g., the first support member 331 of the second support member 360), or may additionally include other components. At least one of the components of the electronic device 300 may be the same as or similar to at least one of the components of the electronic device 101 of FIG. 1 or the electronic device 200 of FIG. 2A, and redundant descriptions will be omitted hereinafter.

The first support member 311 may be coupled with the side bezel structure 310 by being disposed inside the electronic device 300, or may be constructed integrally with respect to the side bezel structure 310. The first support member 311 may be constructed of, for example, a metallic material and/or a non-metallic material (e.g., polymer). The display 330 may be joined to one side of the first support member 311, and the PCB 340 may be joined to the other side thereof. A processor, a memory, and/or an interface may be mounted on the PCB 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a High Definition Multimedia Interface (HDMI), a Universal Serial Bus (USB) interface, an SD card interface, and/or an audio interface. For example, the interface may electrically or physically couple the electronic device 300 and the external electronic device, and may include a USB connector, an SD card/MMC connector, or an audio connector.

The battery 350 is a device for supplying power to at least one component of the electronic device 300, and may include, for example, a non-rechargeable primary cell, a rechargeable secondary cell, or a fuel cell. At least part of the battery 350 may be disposed substantially on the same plane with respect to, for example, the PCB 340. The battery 350 may be disposed integrally inside the electronic device 300, or may be detachably disposed with respect to the electronic device 300.

The antenna 370 may be disposed between the back plate 380 and the battery 350. The antenna 370 may include, for example, a Near Field Communication (NFC) antenna, a wireless charging antenna, and/or a Magnetic Secure Transmission (MST) antenna. The antenna 370 may perform short-range communication, for example, with the external electronic device, or may wirelessly transmit/receive power required for charging. In another embodiment, an antenna structure may be constructed by at least part of the side bezel structure 310 and/or first support member 311 or a combination thereof.

According to an embodiment, an element (e.g., the side bezel structure 310, the first support member 311, the second support member 360, and the back plate 380) constituting an exterior of the electronic device 300 may include a metallic material. The leakage current may flow to a conductive exterior member (e.g., the back plate 380). The leakage current may flow to a human body of a user who carries the electronic device 300. A body response (or symptom) may be discomfort, pain, muscle spasms, burns, or fatalities according to a magnitude of current which passes through the human body. In an embodiment, the electronic device 300 may charge a battery by receiving power supplied from an external power device (e.g., a charging device). Due to a damage or breakage of the external power device, unintended high-voltage AC may be supplied from the external power device to the electronic device 300. The high-voltage AC may be leaked to the conductive exterior member of the electronic device 300, and the leakage current may cause electric shock to the user. Although the conductive exterior member may be designed to include an insulating material coated on its surface, AC current may flow through the insulating material due to fluctuation of an electric potential difference. In another embodiment, the unintended DC overcurrent output from the electronic device 300 may be leaked to the conductive exterior member, which may cause a body reaction such as discomfort, pain, or the like. When the conductive exterior member is aged or damaged such as a case where an insulating material is peeled off due to aging, damage, or the like, a possibility that leakage current flows from the conductive exterior member to a human body may be further increased. According to an embodiment, the electronic device 300 may include a leakage current cutoff circuit electrically coupled with a ground plane (e.g., a ground of a PCB) and the conductive exterior member. For example, the leakage current cutoff circuit may prevent the leakage current from flowing from the ground plane to the conductive exterior member.

Figure 4:
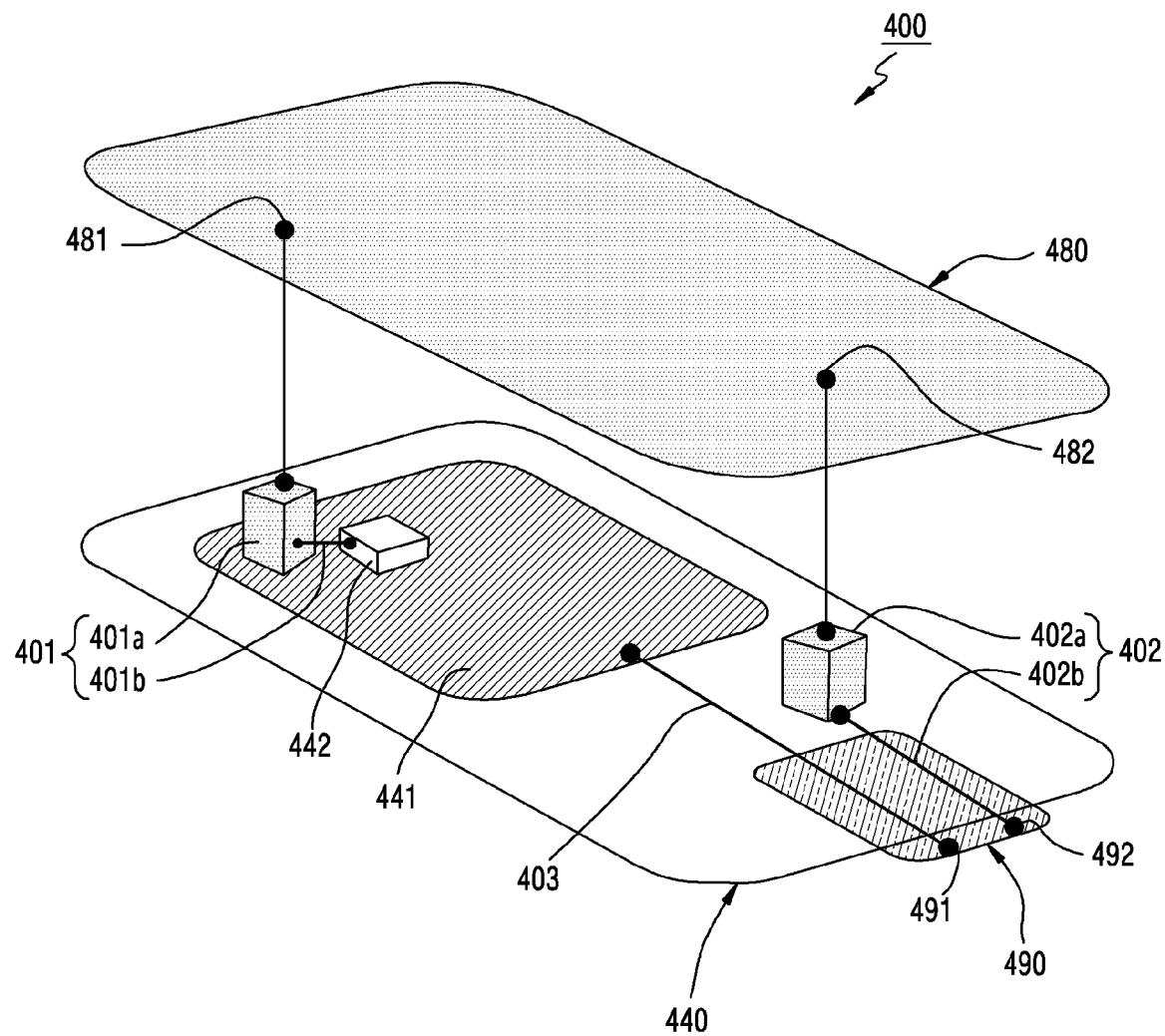
FIG. 4 illustrates an electronic device including a conductive exterior member and a leakage current cutoff circuit according to an embodiment.

FIG. 4 illustrates an electronic device including a conductive exterior member and a leakage current cutoff circuit according to an embodiment. An electronic device 400 of FIG. 4 may include, for example, at least part of the electronic device 101 of FIG. 1, the electronic device 200 of FIG. 2A, or the electronic device 300 of FIG. 3.

Referring to FIG. 4, the electronic device 400 according to an embodiment may include a PCB 440 (e.g., the PCB 340 of FIG. 3), a conductive exterior member 480 (e.g., the back plate 380 or side bezel structure 310 of FIG. 3), and a connector 490. The PCB 440 may include a ground or ground plane 441. A leakage current cutoff circuit 442 may be electrically coupled with the ground plane 441 of the PCB 440. According to various embodiments, the leakage current cutoff circuit 442 may be mounted on the ground plane 441 of the PCB 440.

According to an embodiment, the leakage current cutoff circuit 442 may be electrically coupled with a conductive exterior member 480. The leakage current cutoff circuit 442 may reduce or cut off leakage current which flows from the ground plane 441 to the conductive exterior member 480. When current is not leaked to the conductive exterior member 480, electric shock can be prevented.

According to an embodiment, the leakage current cutoff circuit 442 may be designed to convert high-voltage Alternating Current (AC) input via the connector 490 (e.g., the connecting terminal 178 of FIG. 1 or the connector hole 2271 of FIG. 2A) to low-voltage AC or remove it. According to another embodiment, the leakage current cutoff circuit 442 may be designed to convert high-current AC input via the connector 490 to low-current AC or remove it. In some embodiments, the leakage current cutoff circuit 442 may be designed to convert high-current AC input via the connector 490 to low-current DC or remove it. In some embodiments, the leakage current cutoff circuit 442 may be designed to convert high-voltage AC input via the connector 490 to low-current DC or remove it.

Figure 5:
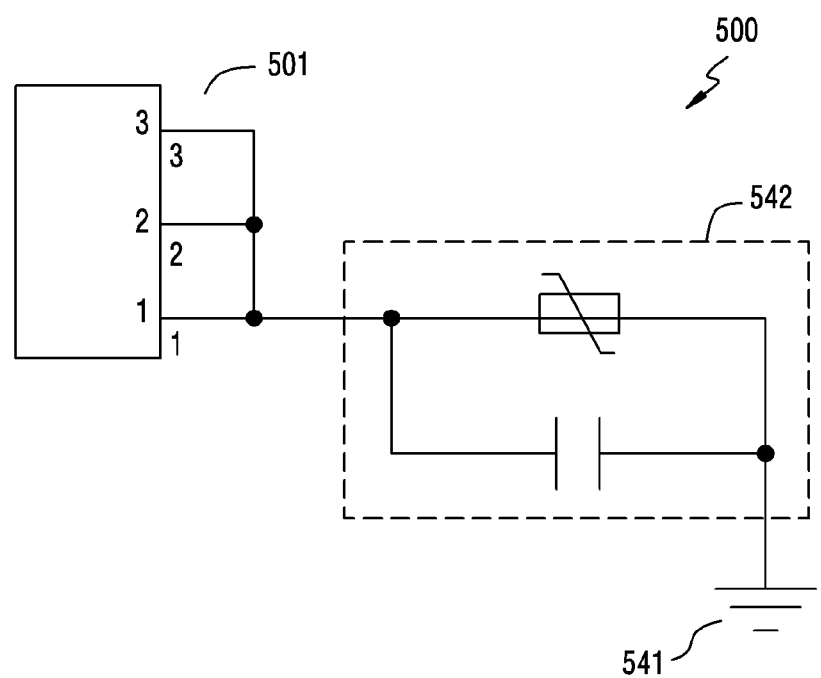
FIG. 5 illustrates a circuit electrically coupled with one point of a conductive exterior member according to an embodiment.

According to an embodiment, the electronic device 400 may include a first conductive path 401 electrically coupling the leakage current cutoff circuit 442 and a first point 481 of the conductive exterior member 480. The first conductive path 401 may include a first contact 401a electrically coupled with the leakage current cutoff circuit 442. According to an embodiment, the first contact 401a may be mounted on a land (or a pad) (not shown) constructed on the PCB 440. FIG. 5 illustrates a circuit 500 electrically coupled with one point (e.g., the first point 481 of FIG. 4) of a conductive exterior member (e.g., 480 of FIG. 4) according to an embodiment. Referring to FIG. 5, a leakage current cutoff circuit 542 (e.g., 442 of FIG. 4) may be electrically coupled with a first contact 501 (e.g., 401a of FIG. 4) and a ground plane 541 (e.g., 441 of FIG. 4). The leakage current cutoff circuit 542 may include at least one active element or passive element. For example, the leakage current cutoff circuit 542 may include a capacitor and/or a varistor as shown in the figure. Although not shown, the leakage current cutoff circuit 542 may be designed to include various other elements such as a diode (e.g., a Transient Voltage Suppressor (TVS) diode) or the like.

Returning to FIG. 4, in an embodiment, the first contact 401a and the leakage current cutoff circuit 442 may be designed as separate elements. For example, the first conductive path 401 may include a line 401b which electrically couples the first contact 401a and the leakage current cutoff circuit 442. The line 401b may be a conductive path (or a conductive pattern) constructed on the PCB 440.

In some embodiments, although not shown, the leakage current cutoff circuit 442 may be implemented directly in the first contact 401a. For example, the first contact 401a may be designed such that capacitance is constructed structurally. For example, the first contact 401a may include a capacitance constructing structure having a shape including two metal plates and a dielectric material disposed between the metal plates.

According to some embodiments, although not shown, the first contact 401a may be designed to include the leakage current cutoff circuit 442. For example, the first contact 401a may be a component including the leakage current cutoff circuit 442 (e.g., a capacitor).

According to various embodiments, although not shown, the first contact 401a may be disposed on the leakage current cutoff circuit 442. For example, the first contact 401a may be disposed between the leakage current cutoff circuit 442 and the first point 481.

According to various embodiments, the first contact 401a may be a flexible conductive member such as a C-clip, a pogo-pin, a spring, a conductive poron and rubber, a conductive tape, a cooper connector, or the like. The flexible conductive member may improve electrical coupling between the PCB 440 and the conductive exterior member 480.

Figure 6:
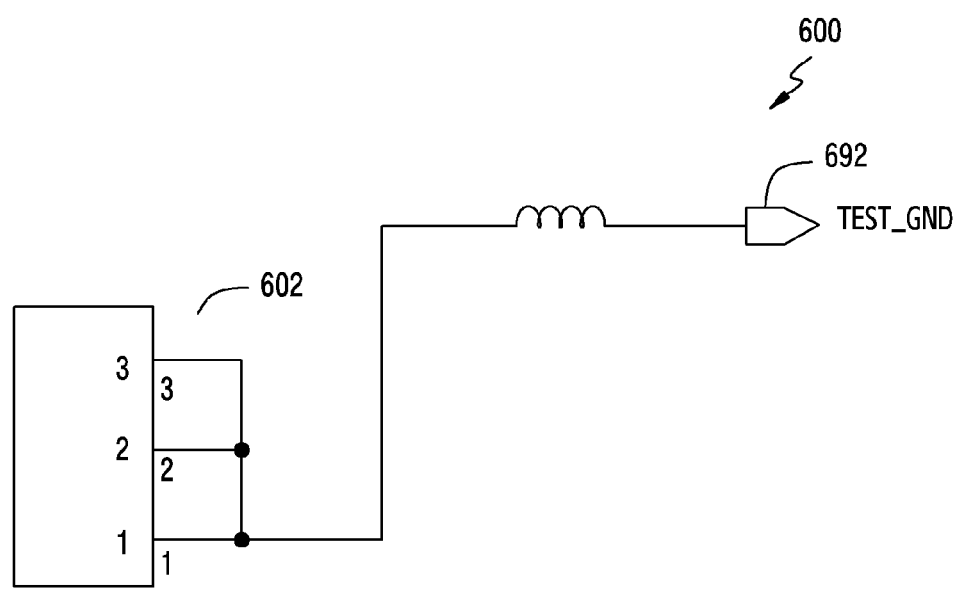
FIG. 6 illustrates a circuit electrically coupled with one point of a conductive exterior member according to an embodiment.

Returning to FIG. 4, according to an embodiment, the electronic device 400 may include a second conductive path 402 which electrically couples at least one pin 492 out of a plurality of pins of the connector 490 (e.g., the connecting terminal 178 of FIG. 1) and a second point 482 of the conductive exterior member 480. The second conductive path 402 may include a second contact 402a electrically coupled with at least one pin 492 of the connector 490. According to an embodiment, the second contact 402a may be mounted on a land (e.g., a copper foil pad) constructed on the PCB 440. The second conductive path 402 may include a line 402b which electrically couples the second contact 402a and at least one pin 492. According to an embodiment, the line 402b may be a conductive pattern constructed on the PCB 440. According to an embodiment, the second contact 402a may be a flexible conductive member such as a C-clip, a pogo-pin, a spring, a conductive poron and rubber, a conductive tape, a cooper connector, or the like. FIG. 6 illustrates a circuit 600 electrically coupled with one point (e.g., the second point 482 of FIG. 4) of a conductive exterior member (e.g., 480 of FIG. 4) according to an embodiment. Referring to FIG. 6, at least one pin 692 (e.g., 492 of FIG. 4) of a connector (e.g., 490 of FIG. 4) may be electrically coupled with a second contact 602 (e.g., 402a of FIG. 4).

Returning to FIG. 4, according to an embodiment, at least one pin 491 of the connector 490 (e.g., the connecting terminal 178 of FIG. 1) may be electrically coupled with the ground plane 441. A third conductive path 403 which electrically couples the ground plane 441 and at least one pin 491 of the connector 490 may be constructed on the PCB 440.

According to an embodiment, if there is a deterioration in leakage current cutoff performance (e.g., a breakage in the leakage current cutoff circuit (442 of FIG. 4)), leakage current may flow from the ground plane 441 to the conductive exterior member 480, which may electrically shock a user who carries the electronic device 400. According to an embodiment, the electronic device 400 may couple at least one first pin 491 of the connector 490 and couple at least one second pin 492 of the connector 490 to the conductive exterior member 480 to provide a device which couples between the ground plane 441 and the conductive exterior member 480 to the leakage current cutoff circuit 442. According to various embodiments, leakage current cutoff performance of the electronic device 400 may be easily detected by coupling an external electronic device (e.g., 102 of FIG. 1) to the connector 490.

Figure 7:
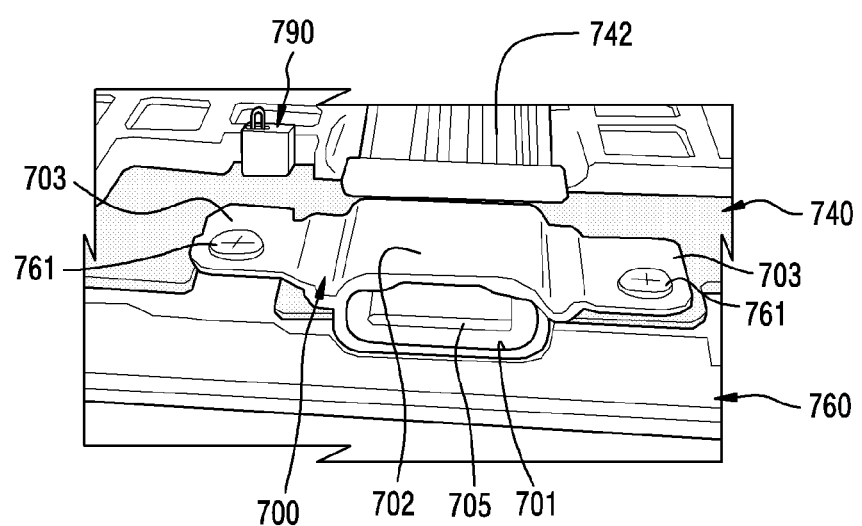
FIG. 7 illustrates a state in which a receptacle is mounted on an electronic device according to an embodiment.

Returning to FIG. 3, in an embodiment, the side bezel structure 310 may include an opening 3101 (e.g., the connector hole 2271 of FIG. 2A), and a connector (e.g., 490 of FIG. 4) may be mounted to be disposed inside the opening or to be aligned with the opening. According to an embodiment, the connector may include a female connector (hereinafter, a receptacle) designed to be bonded with a male connector (hereinafter, a plug) of an external electronic device (e.g., 102 of FIG. 1). FIG. 7 illustrates a state in which a receptacle is mounted on an electronic device according to an embodiment. Referring to FIG. 7, a receptacle 700 may be mounted on a PCB 740. According to an embodiment, the PCB 740 of FIG. 7 may be separated from the PCB 340 of FIG. 3, and the PCBs 340 and 740 may be electrically coupled by means of a connecting member (e.g., FPCB) 742. In some embodiments, although not shown, the PCB 340 of FIG. 3 or the PCB 440 of FIG. 4 may be designed to include the PCB 740 of FIG. 7. According to an embodiment, the receptacle 700 and the PCB 740 may be coupled to a support member 760 (e.g., the first support member 311 or second support member 360 of FIG. 3) by using a bolt 761. According to an embodiment, the receptacle 700 may include a shell 702 including an opening 701 and an extension portion 703 extended to both sides of the shell 702. For example, the opening 701 may be aligned with the connector hole 2271 of FIG. 2A (or the opening 3101 of FIG. 3), and a plug (not shown) of an external electronic device (e.g., 102 of FIG. 1) may be inserted to the housing 702 of the receptacle 700 through the connector hole 2271. The extension portion 703 is a portion to which the bolt 761 is fastened, and may include a hole (not shown) penetrated by the bolt 761. For the bolt fastening, the PCB 740 may include a hole (not shown) aligned with the hole of the extension portion 703. For the bolt fastening, the support member 760 may include a bolt fastening boss (not shown) aligned with the hole of the extension portion 703. According to an embodiment, the receptacle 700 may include a tongue 705 disposed to a space of the housing 702. The receptacle 700 may include a plurality of pins (or contacts) (not shown) disposed to the tongue 705. When the plug of the external electronic device (e.g., 102 of FIG. 1) is bonded to the receptacle 700, the plurality of pins of the tongue 705 may be electrically coupled to the pins included in the plug of the external electronic device.

Referring to FIG. 7, a flexible conductive member 790 may be mounted on the PCB 740. According to an embodiment, the flexible conductive member 790 may be the second contact 402a of FIG. 4. Although the flexible conductive member 790 may be a C-clip as illustrated, it may be replaced with a pogo-pin, a spring, a conductive poron and rubber, a conductive tape, a cooper connector, or the like.

Figure 8:
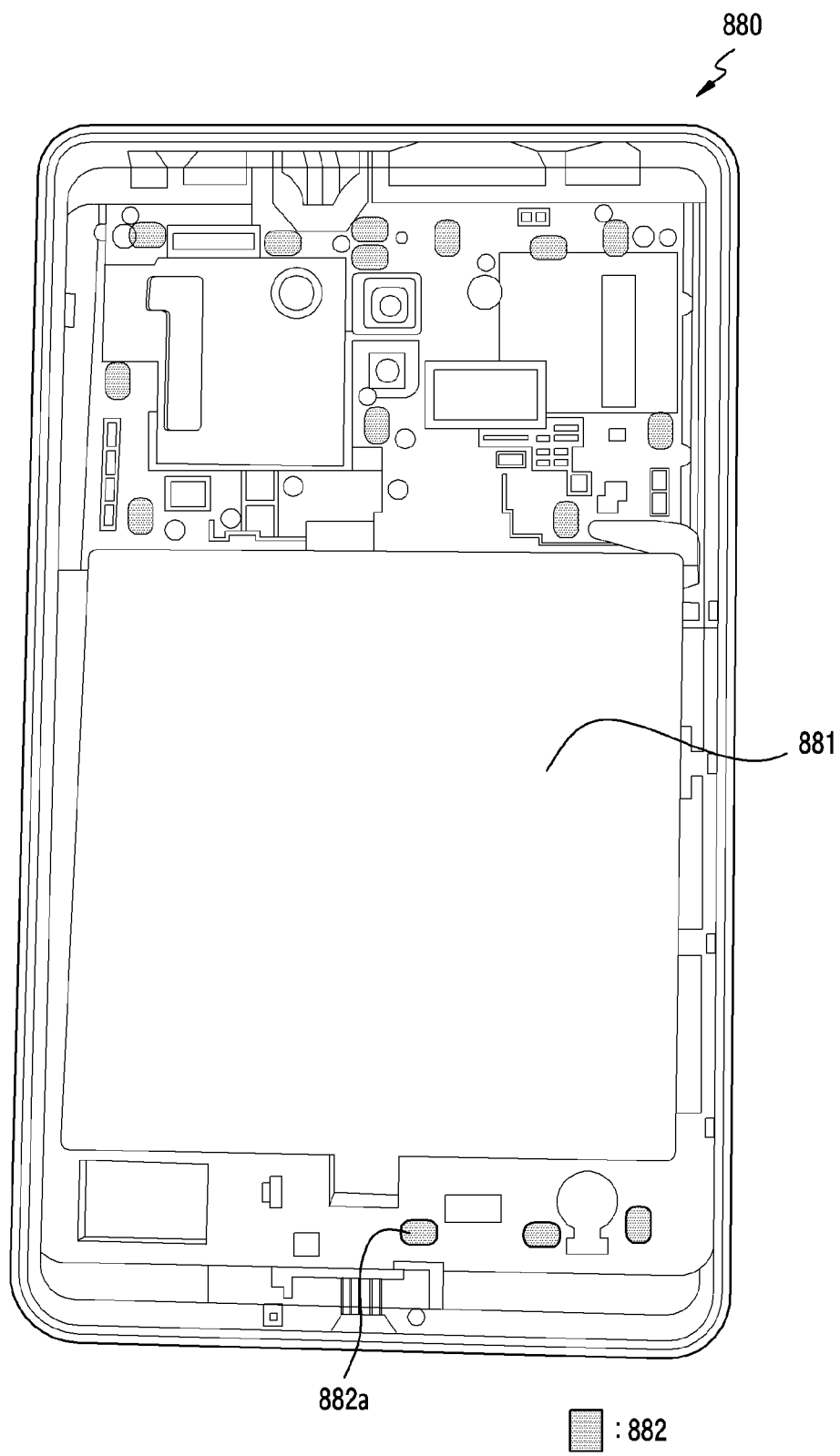
FIG. 8 illustrates a back plate according to an embodiment.

FIG. 8 illustrates a back plate according to an embodiment.

Referring to FIG. 8, a back plate 880 (e.g., 380 of FIG. 3 or the conductive exterior member 480 of FIG. 4) may include a plurality of contacts 882 constructed on a face 881 facing a PCB (e.g., 340 of FIG. 3 or 440 of FIG. 4). At least one contact 882a out of the plurality of contacts 882 may correspond to the second point 482 of FIG. 4. Although not shown, at least one of the plurality of contacts 882 may correspond to the first point 481 of FIG. 4.

Figure 9:
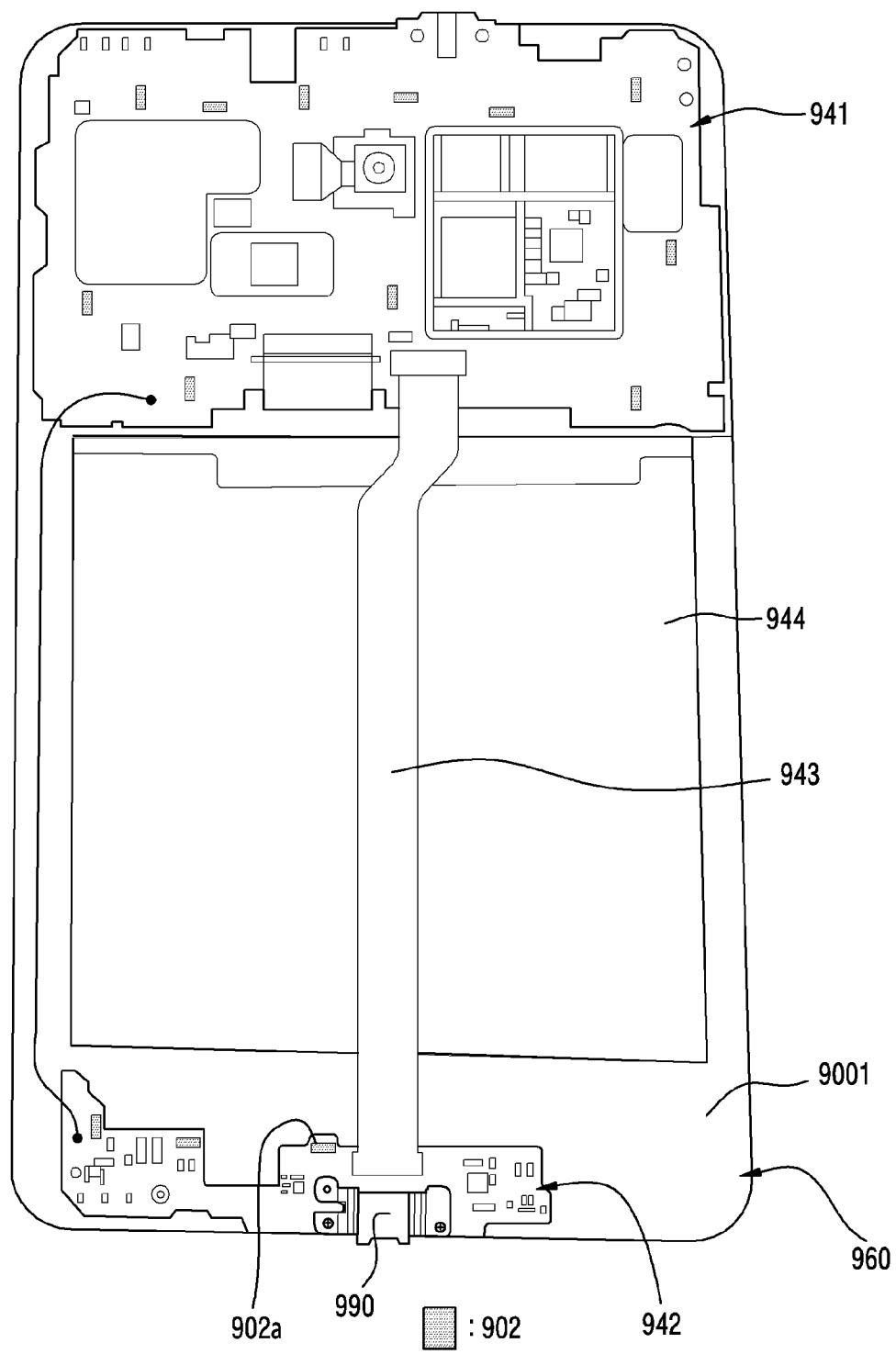
FIG. 9 illustrates a state in which a Printed Circuit Board (PCB) is joined with a support member according to an embodiment.

FIG. 9 illustrates a state in which a PCB is joined with a support member according to an embodiment.

Referring to FIG. 9, a first PCB 941 (e.g., the PCB 340 of FIG. 3) and a second PCB 942 (e.g., the PCB 740 of FIG. 7) may be coupled to a face 9001 of a support member 960 (e.g., the first support member 311 or second support member 360 of FIG. 3) facing a back plate (e.g., 380 of FIG. 3 or 880 of FIG. 8). According to an embodiment, the support member 960 is rectangular, and the first PCB 941 and the second PCB 942 may be disposed to be separated from each other in a lengthwise direction. An FPCB 943 (e.g., the connecting member 742 of FIG. 7) may electrically couple the first PCB 941 and the second PCB 942. According to various embodiments, a battery (e.g., 350 of FIG. 3) may be disposed to a space 944 between the first PCB 941 and the second PCB 942. According to an embodiment, the first PCB 941 and the second PCB 942 may include a plurality of flexible conductive members 902 corresponding to the contacts 882 of FIG. 8. The flexible conductive members 902 may include the contacts 401a and 402a of FIG. 4. According to an embodiment, at least one flexible conductive member 902a disposed near (e.g., within about 20 mm) the connector 990 (e.g., 490 of FIG. 4) may be the second contact 402a of FIG. 4.

In an embodiment, a plurality of pins of a connector (e.g., 490 of FIG. 4 or 700 of FIG. 7) may include tails (not shown) for electrical coupling with a PCB (e.g., 440 of FIG. 4 or 740 of FIG. 7).

According to various embodiments, although not shown, the electronic device may be designed as a watch which can be worn on a user's wrist. The watch includes a housing constituting an exterior. The housing may include a first face (a front face) and a second face (a back face), facing in different directions, and a third face (a side face) having a substantially ring shape surrounding a space between the first face and the second face. When the watch is worn on the user's wrist, the second face may be covered in contact with the user's wrist, and a display may be exposed through the first face. According to an embodiment, the second face of the watch may be constructed by a back plate including a metallic material. The back plate of the watch may include a plurality of contacts such as the back plate 880 of FIG. 8. In an embodiment, the back plate of the watch may be electrically coupled with a leakage power cutoff circuit mounted on the PCB of the watch. For example, the PCB and the back plate contacts of the watch may be electrically coupled by means of a flexible conductive member (e.g., an FPCB, a C-clip, a pogo-pin, a spring, a conductive poron and rubber, a conductive tape, a cooper connector, etc.).

In some embodiments, although not shown, there may be one or more contacts disposed to a side member (e.g., 203 of FIG. 2A or the side bezel structure 310 of FIG. 3), and the leakage current cutoff circuit of the PCB (e.g., 340 of FIG. 3, 440 of FIG. 4, or 941 of 942 of FIG. 9) may be electrically coupled with these contacts. For example, the PCB and the plurality of contacts of the side member may be electrically coupled by means of a flexible conductive member (e.g., an FPCB, a C-clip, a pogo-pin, a spring, a conductive poron and rubber, a conductive tape, a cooper connector, etc.). According to various embodiments, when the electronic device is designed as a watch, a conductive member constituting a side face of the watch may be electrically coupled with the leakage current cutoff circuit.

In some embodiments, although not shown, there are one or more contacts disposed to a front plate (e.g., 201 of FIG. 2A or 320 of FIG. 3), and the leakage current cutoff circuit of the PCB (e.g., 340 of FIG. 3, 440 of FIG. 4, or 941 or 942 of FIG. 9) may be electrically coupled with these contacts. According to various embodiments, when the electronic device is designed as a watch, a front face of the watch may be constructed by a screen and a conductive member surrounding the screen, and the conductive member may be electrically coupled with the leakage current cutoff circuit.

Figure 10:
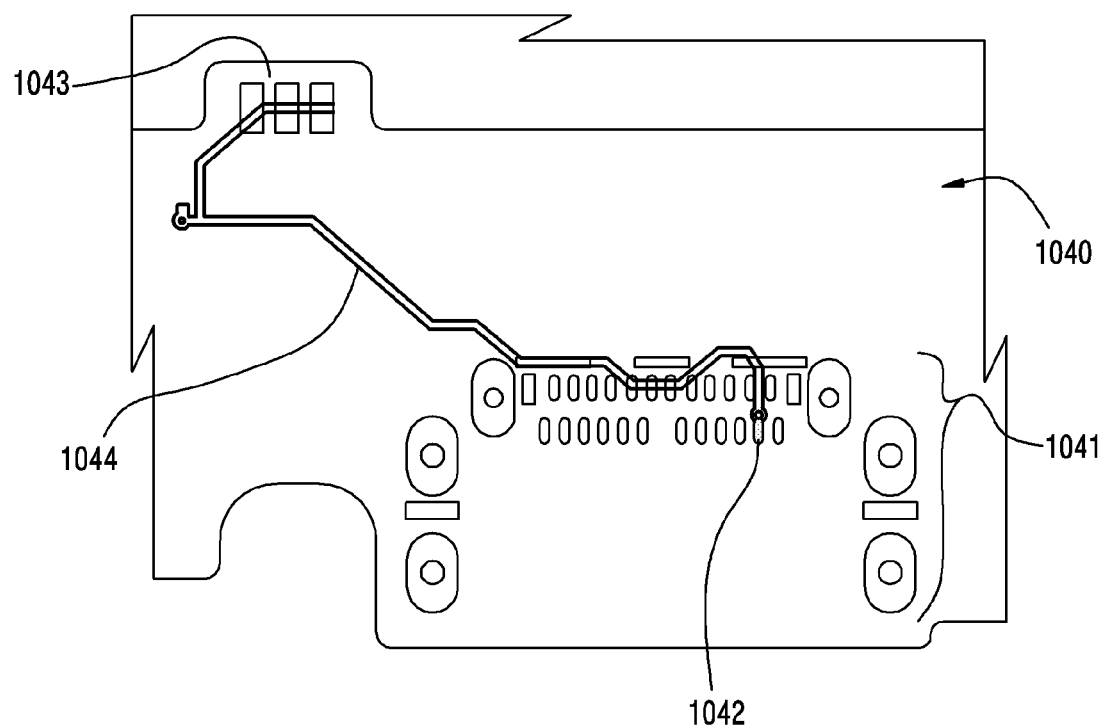
FIG. 10 illustrates a PCB according to an embodiment.

FIG. 10 illustrates a PCB according to an embodiment.

Referring to FIG. 10, a PCB 1040 (e.g., 440 of FIG. 4) may include first lands (or pads) 1041 electrically coupled (e.g., soldered) with tails of a connector (e.g., 490 of FIG. 4 or 700 of FIG. 7). According to an embodiment, the PCB 1040 may include second contact(s) (or second land(s)) on which the second contact 402a of FIG. 4 is mounted. According to an embodiment, the PCB 1040 may include a conductive path (or a conductive pattern) 1044 (e.g., 402b of FIG. 4) electrically coupling at least one first land 1042 and second land(s) 1043. According to various embodiments, at least part of the conductive path 1044 may be constructed on a layer different from that of the first lands 1041 or the second land(s) 1043, and may be electrically coupled with the first land 1042 or the second land(s) through a via. For example, the first lands 1041 or the second land(s) may be constructed on an outer face of the PCB 1040, and at least part of the conductive path 1044 may be disposed inside the PCB 1040.

Figure 11A:
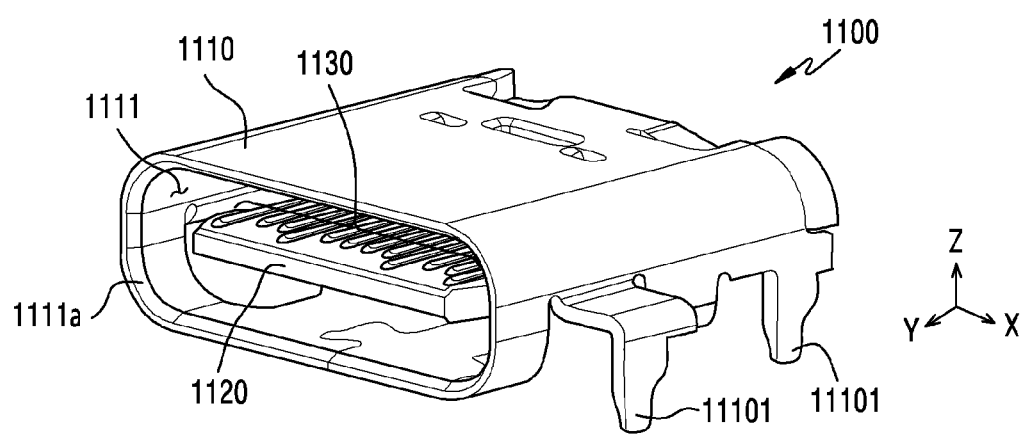
FIG. 11A is a perspective view of a receptacle mounted on an electronic device having a conductive exterior member according to an embodiment.
Figure 11B:
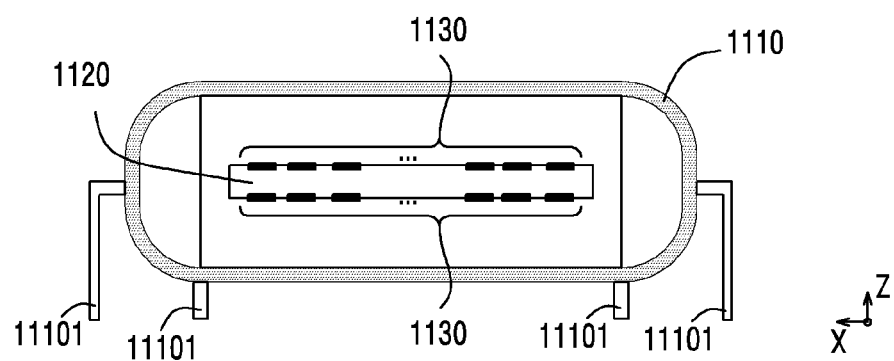
FIG. 11B illustrates a pin arrangement structure of a receptacle according to an embodiment.
Figure 11C:
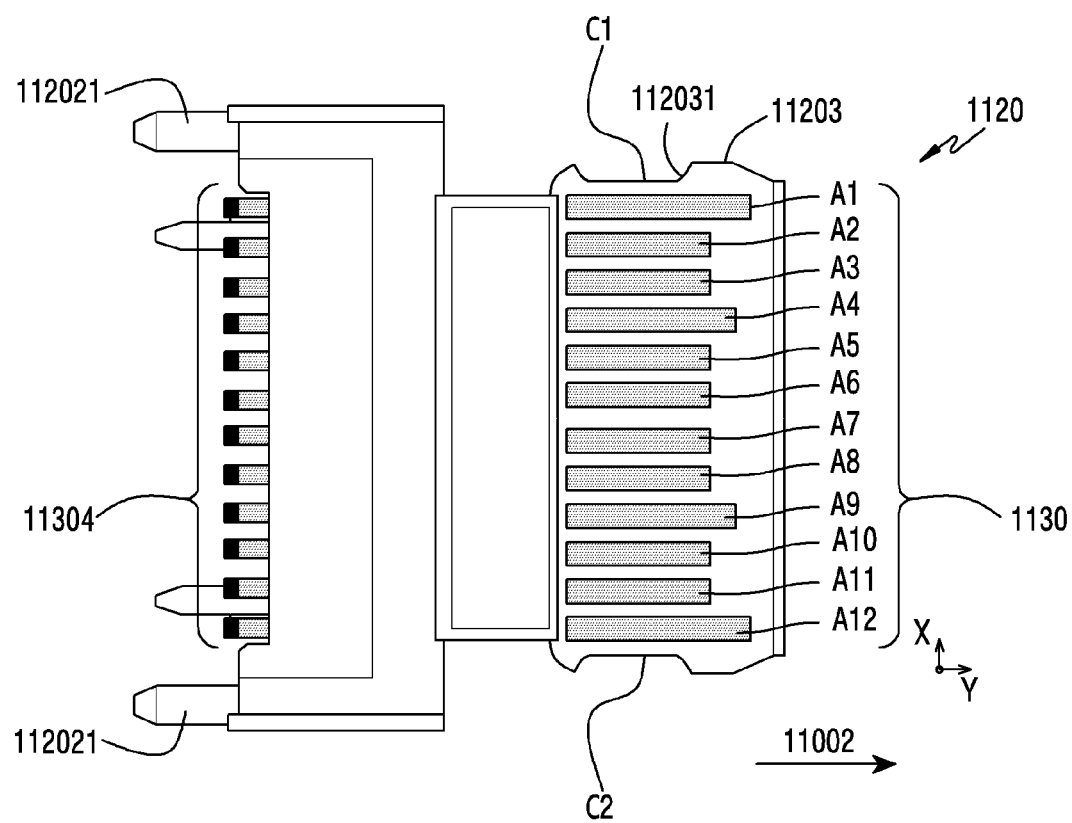
FIG. 11C illustrates a pin arrangement structure of a receptacle according to an embodiment.
Figure 11D:
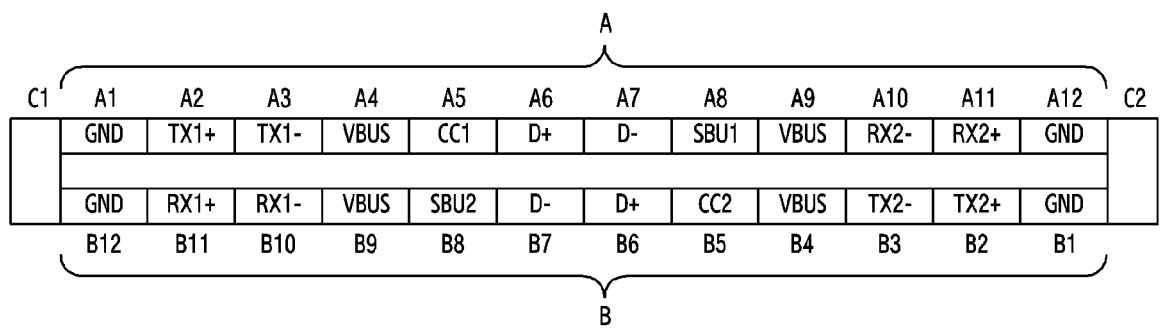
FIG. 11D illustrates a pin map of a receptacle according to an embodiment.
Figure 12:
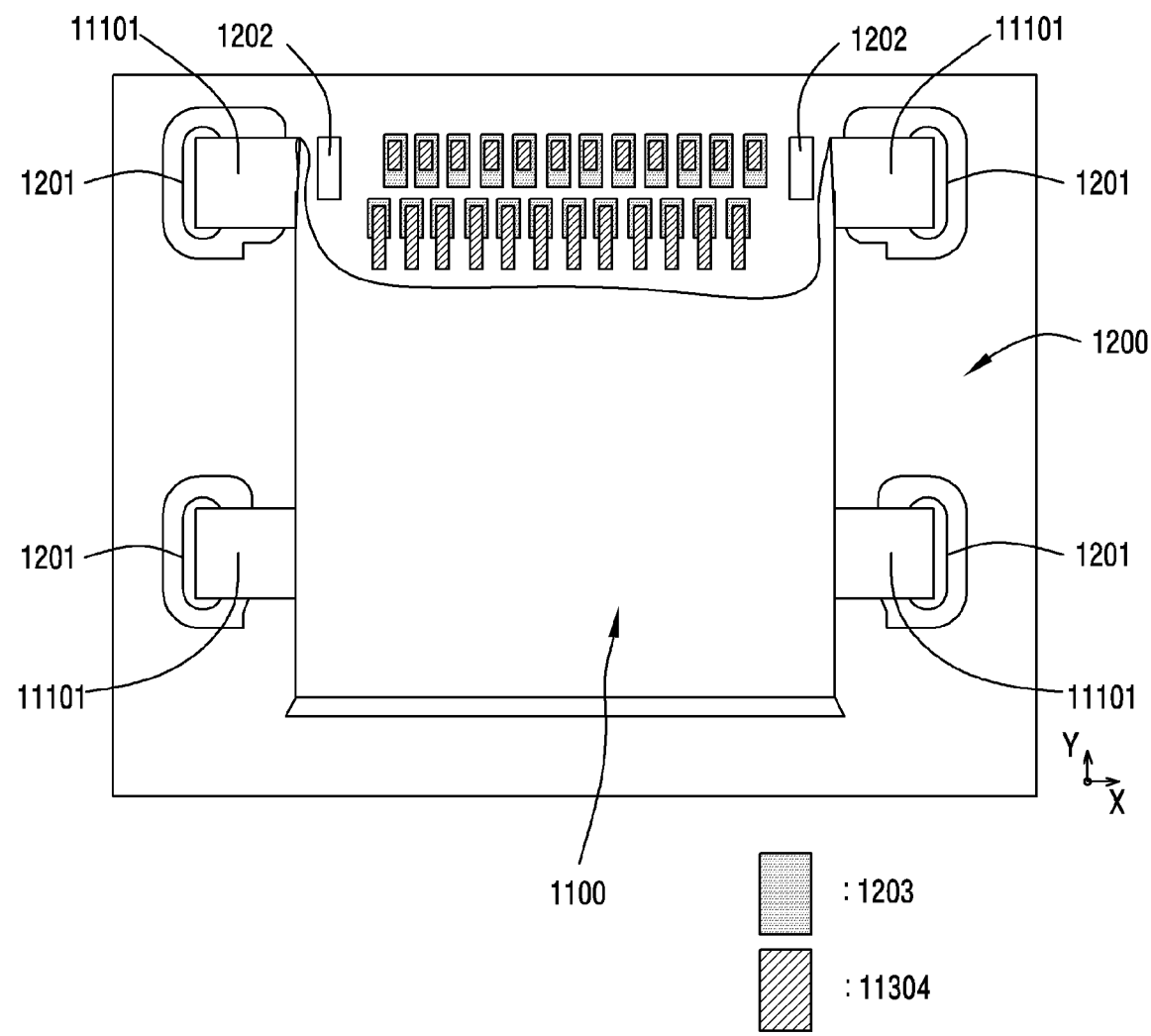
FIG. 12 illustrates a PCB on which a receptacle is mounted according to an embodiment.

FIG. 11A is a perspective view of a receptacle mounted on an electronic device having a conductive exterior member according to an embodiment. FIG. 11B and FIG. 11C illustrate a pin arrangement structure of a receptacle according to an embodiment. FIG. 11D illustrates a pin map of a receptacle according to an embodiment. FIG. 12 illustrates a PCB on which a receptacle is mounted according to an embodiment. According to various embodiments, a receptacle 1100 may be a type-C connector or a reversible connector. For example, the type-C plug is connectable to the receptacle 1100 without distinction of up and down. According to various embodiments, the receptacle 1100 may be a connector supporting a Universal Serial Bus (USB) 2.x or 3.x.

Referring to FIG. 11A and FIG. 11B, the receptacle 1100 may include, for example, a shell 1110, a tongue 1120, and a plurality of pins 1130. The shell 1110 has a substantially tubular shape of which one side is open, and may include a passage 1111 capable of inserting a plug (not shown). An opening 111a may be constructed at one side of the passage 1111, and the plug may move into the passage 1111 of the shell 1110 through the opening 1111a. The passage 1111 of the shell 1110 may be extended straight in a movement direction of the plug, and the plug may be at least partially inserted into the shell 1110 by being guided to the passage 1111 of the shall 1110.

According to an embodiment, at least part of the shell 1110 may include a conductive material (e.g., stainless steel or phosphor bronze) or a non-conductive material. According to an embodiment, the shell 1110 may include a plurality of leads 11101 protruding outwardly. Referring to FIG. 12, the plurality of leads 11101 may be inserted to a plurality of component holes 1201 of the PCB 1200 (e.g., 440 of FIG. 4), and an end portion thereof may protrude to the opposite side of the PCB 1200. The PCB 1200 may include a soldering land (e.g., a copper foil pad) (not shown) around the plurality of component holes 1201. An end portion of the plurality of leads 11101 may be electrically coupled (e.g., soldering) with a land of the PCB 1200 by using a conductive material such as a solder. According to an embodiment, the plurality of leads 11101 of the shell 1110 may be electrically coupled with a ground plane (e.g., 441 of FIG. 4) of the PCB 1200.

Returning to FIG. 11A and FIG. 11B, in an embodiment, although not shown, the tongue 1120 may include a base-plate constructed of a non-conductive material (e.g., glass-filled nylon) and a mid-plate disposed inside the base-plate. The base-plate may be constructed of the non-conductive material, and the plurality of pins 1130 may be disposed to the base-plate. According to an embodiment, at least part of the mid-plate may include a conductive material or a non-conductive material. A conductive portion of the mid-plate may be electrically coupled with a PCB (e.g., 1200 of FIG. 12). Referring to FIG. 11C, the mid-plate may include at least one lead 112021 extended from the tongue 1120. Referring to FIG. 11C and FIG. 12, the lead 112021 of the mid-plate may be electrically coupled with a land 1202 of the PCB 1200 by using a conductive material such as a solder. According to various embodiments, the conductive portion of the mid-plate may be electrically coupled with a ground plane (e.g., 441 of FIG. 4) of the electronic device (e.g., 400 of FIG. 4).

Referring to FIG. 11C, the plurality of pins 1130 may be disposed to the tongue 1120 (e.g., the base-plate). The plurality of pins 1130 may include tails 11304 used for electrical coupling with the PCB (e.g., 1200 of FIG. 12). For example, referring to FIG. 12, the tails 11304 may be electrically coupled with lands 1203 of the PCB 1200 by using a conductive material such as a solder.

Referring to FIG. 11C, the tongue 1120 of the receptacle 1100 may include a hook fastening portion 112031 that can be fastened with a hook of a plug. In a plan view, the hook fastening portion 112031 may be constructed at a side face 11203 of the tongue 1120, and may include an engaging recess for preventing the hook of the plug from being released in a separation direction 11002 of the plug.

Referring to FIG. 11D, the plurality of pins 1130 of the receptacle 1100 may include A-pins A and B-pins B. According to an embodiment, the A-pins A may include a ground pin A1, pins A2, A3, A10, and A11 supporting high-speed data transmission, pins A4 and A9 supporting power supplying, a Channel Configuration (CC) pin A5, a SideBand Use (SBU) pin A8, and pins A6 and A7 supporting low-speed data transmission. The B-pins B may be for the same functionality with the A-pins A. In an embodiment, to design a type-C connector, the A-pins A and the B-pins B may be arranged in an opposite order. According to an embodiment, the receptacle 1100 may include C-pins C1 and C2. The A-pins A and the B-pins B may be disposed between the C-pins C1 and C2. According to an embodiment, the C-pins C1 and C2 may be constructed at the side face 11203 of a tongue (e.g., 1120 of FIG. 11C). For example, the C-pins C1 and C2 may be constructed by a conductive portion (e.g., a mid-plate) of the tongue 1120.

Figure 13A:
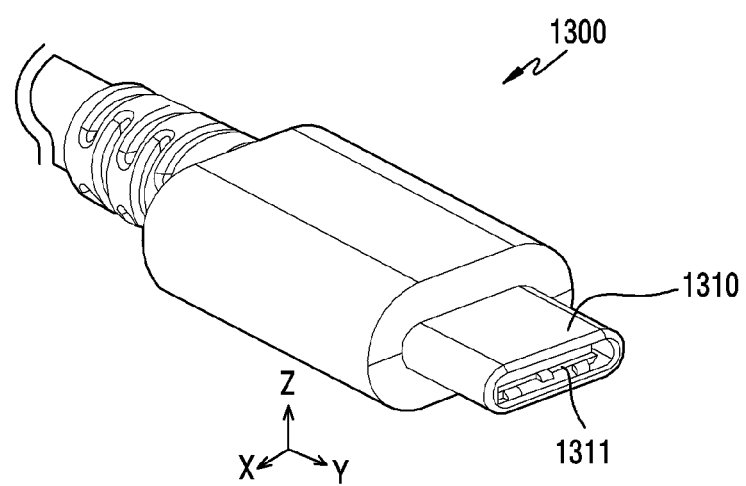
FIG. 13A is a perspective view of a plug according to an embodiment.
Figure 13B:
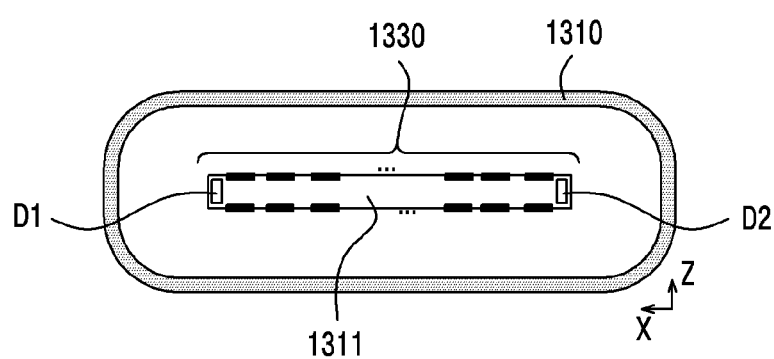
FIG. 13B illustrates a pin arrangement structure according to an embodiment.
Figure 13C:
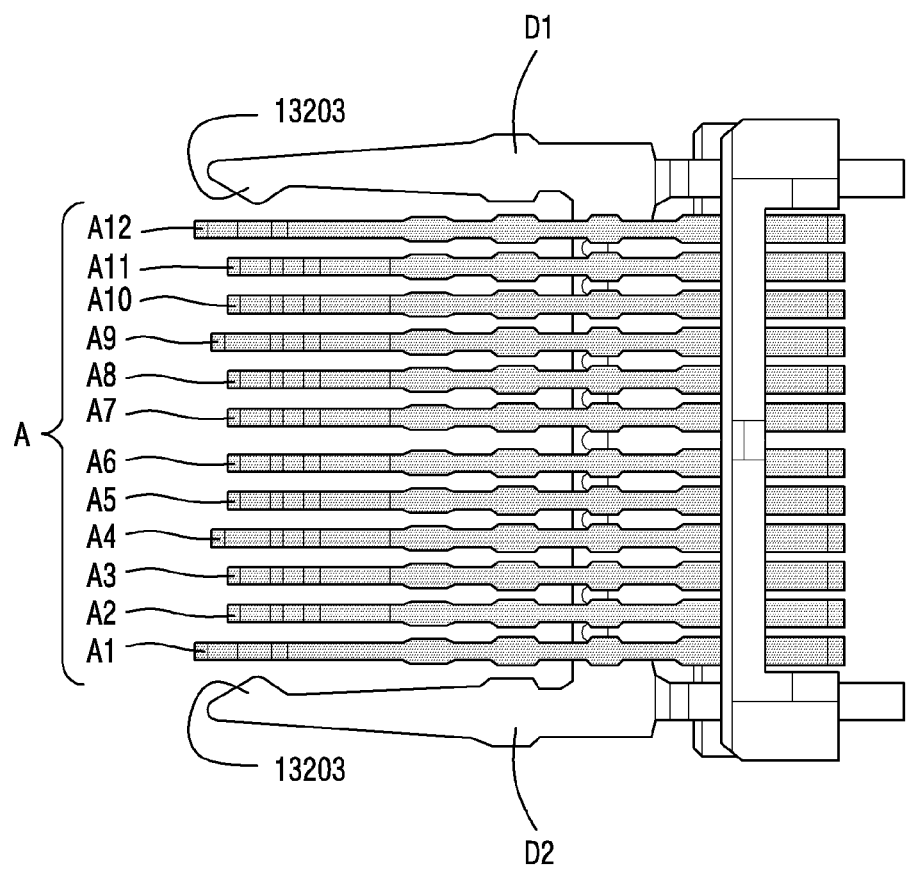
FIG. 13C illustrates a pin arrangement structure according to an embodiment.

FIG. 13A is a perspective view of a plug according to an embodiment. FIG. 13B and FIG. 13C illustrate a pin arrangement structure according to an embodiment.

Referring to FIG. 13A, FIG. 13B, and FIG. 13C, in an embodiment, a plug 1300 may include a shell 1310 and a plurality of pins 1330. The shell 1310 may have an exterior that can be engaged to the passage 1111 of the shell 1110 of a receptacle (e.g., 1100 of FIG. 11A). According to an embodiment, the shell 1310 may include a slot 1311 which is open in one side. The plurality of pins 1330 may be disposed to an inner face of the slot 1311. For example, when the receptacle (e.g., the receptacle 1100 of FIG. 11A) and the plug 1300 are coupled, the shell 1310 may be inserted to the passage 1111 of the shell 1110 of the receptacle 1100, and the tongue 1120 of the receptacle 1100 may be inserted to the slot 1311. When the tongue 1120 of the receptacle 1100 is inserted to the slot 1311, the plurality of pins 1130 disposed to the tongue 1120 of the receptacle 1100 may be electrically coupled with the plurality of pins 1330 disposed to the slot 1311. According to an embodiment, the plug 1300 may be a type-C connector, and the plurality of pins 1330 of the plug 1300 may be arranged to correspond to the plurality of pins 1130 of the receptacle 1100 of FIG. 11.

According to an embodiment, the plug 1300 may include D-pins D1 and D2. For example, A-pins A and B-pins B (not shown) may be disposed to the opposite sides, and may be disposed between the D-pins D1 and D2. According to an embodiment, the D-pins D1 and D2 may be used for physical fastening and electrical coupling between the receptacle (e.g., 1100 of FIG. 11) and the plug 1300. For example, one end portion of the D-pins D1 and D2 may be fixed, and the other end portion thereof may be free, such as a cantilever. The free end portion of the D-pins D1 and D2 may include a hook 13203 for snap-fit fastening. For example, when the plug 1300 is inserted to the receptacle (e.g., 1100 of FIG. 11A), the D-pins D1 and D2 may be fastened to a hook fastening portion (e.g., 112031 of FIG. 11C) of the receptacle 1100 through elasticity bending deformation, and may be electrically coupled with the C-pins (e.g., C1 and C2 of FIG. 11D) of the receptacle 1100.

Returning to FIG. 11C and FIG. 11D, in an embodiment, at least one of the C-pins C1 and C2 of the receptacle 1100 may be at least one pin 492 of FIG. 4. According to an embodiment, a plug (e.g., 1300 of FIG. 13A) of an external electronic device (e.g., 102 of FIG. 1) may be connected to the receptacle 1100, and the external electronic device may detect leakage current through at least one of ground pins A1, A12, B1, and B12 of the receptacle 1100 and at least one of the C-pins C1 and C2.

Figure 14:
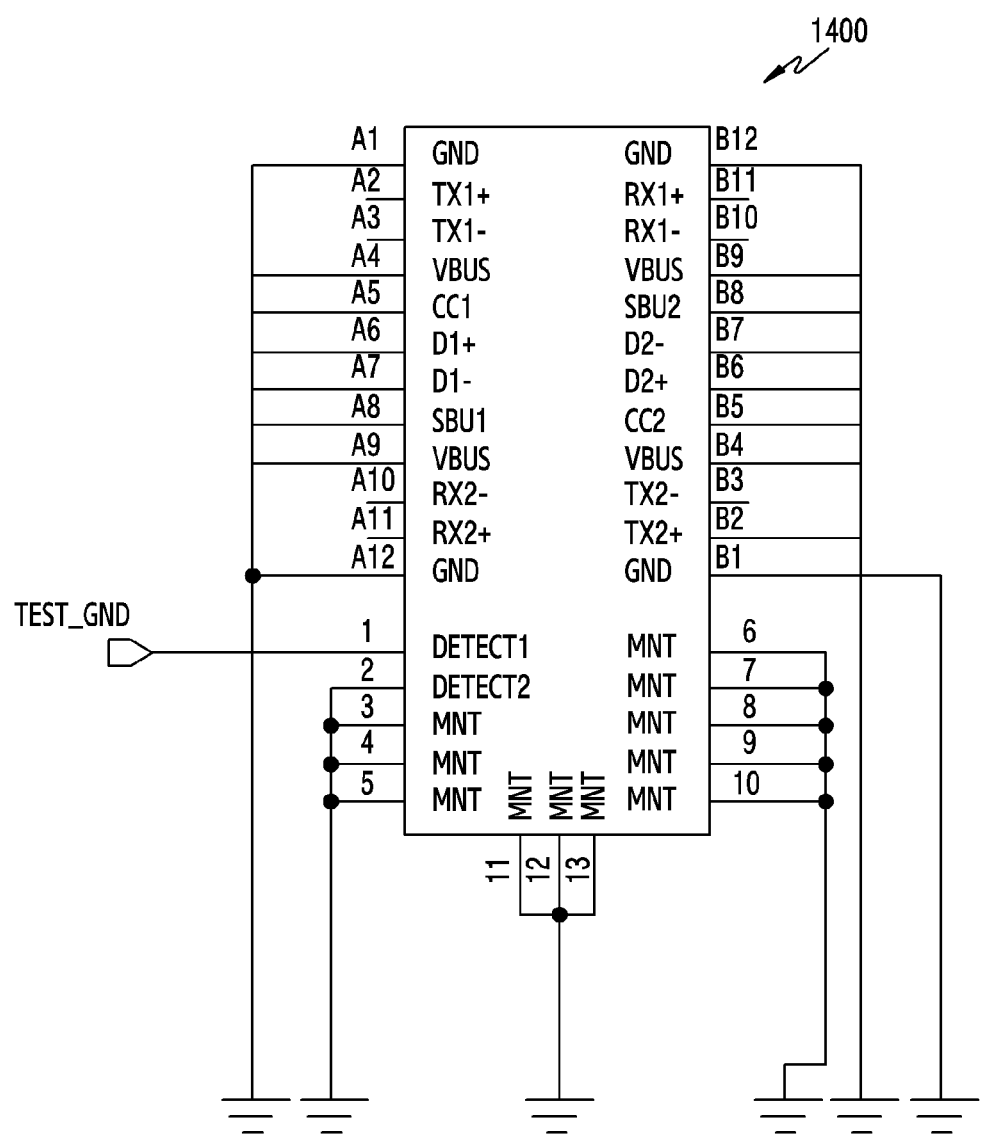
FIG. 14 illustrates a circuit for a receptacle in an electronic device having a conductive exterior member according to an embodiment.

FIG. 14 illustrates a circuit for a receptacle in an electronic device having a conductive exterior member according to an embodiment.

Referring to FIG. 14, it may be designed such that at least one of pins (a 'DETECT1' pin and a 'DETECT2' pin) corresponding to the pins C1 and C2 of FIG. 11D is electrically coupled to a conductive exterior member (e.g., 480 of FIG. 4). As illustrated, it may be designed such that the 'DETECT1' pin is electrically coupled with the conductive exterior member (e.g., 480 of FIG. 4), which may correspond to the pin 492 of FIG. 4. A plug (e.g., 1300 of FIG. 13A) of the external electronic device (e.g., 102 of FIG. 1) may be connected to a receptacle 1400, and the external electronic device may detect leakage current through the 'DETECT1' pin with respect to at least one of the ground pins A1, A12 B1, and B12 of the receptacle 1400. In some embodiments, although not shown, it can also be designed such that the 'DETECT2' pin replaces the 'DETECT1' pin, as a pin corresponding to the pin 492 of FIG. 4. In some embodiments, although not shown, it can also be designed such that both the 'DETECT1' pin (e.g., the C1-pin of FIG. 11D) and the 'DETECT2' pin (e.g., the C2-pin of FIG. 11D) are configured as the pin 492 of FIG. 4. According to some embodiments, although not shown, a pin which is not designed as the pin 492 of FIG. 4 out of the 'DETECT1' pin and the 'DETECT2' pin may be used for the purpose of detecting that a plug (e.g., 1300 of FIG. 13A) is connected to the receptacle 1400.

According to some embodiments, a receptacle (e.g., 1100 of FIG. 11A) may be used in communication for a USB 3.x or higher protocol, and at least one pin different from the C1-pin C1 and the C2-pin C2 may be designed as the pin 492 of FIG. 4.

According to an embodiment, the receptacle (e.g., 1100 of FIG. 11A) may support backward compatibility. For example, the receptacle 1100 may be designed to support the USB 3.x protocol. Returning to FIG. 11D, it may be designed such that an electronic device (e.g., 101 of FIG. 1 or 200 of FIG. 2A) on which the receptacle 1100 is mounted supports not the USB 3.x protocol but a USB 2.x protocol. In this case, in the receptacle 1100, pins A2, A3, A10, A11, B2, B3, B10, and B11 (or reserved pints) supporting high-speed data transmission or pins C1 and C2 for mechanical fastening with a plug may be designed as a pin not used in communication through the USB 2.x protocol.

Figure 15:
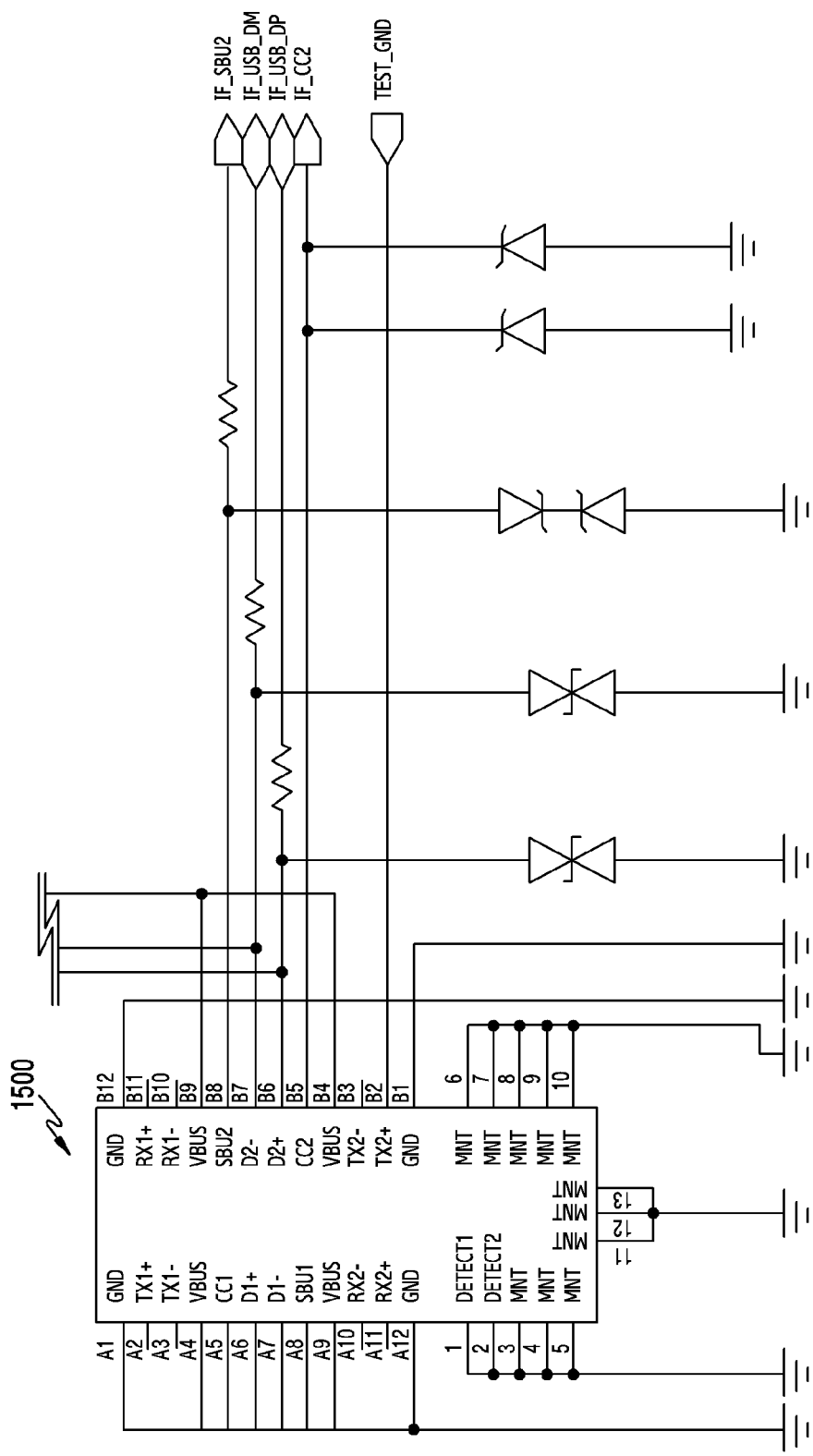
FIG. 15 illustrates a circuit for a receptacle in an electronic device having a conductive exterior member according to an embodiment.

FIG. 15 illustrates a circuit for a receptacle in an electronic device having a conductive exterior member according to an embodiment.

Referring to FIG. 15, it may be designed such that at least one of pins (e.g., A2, A3, A10, A11, B2, B3, B10, B11, C1, or C2) not used in communication through a corresponding USB protocol is electrically coupled with a conductive exterior member (e.g., 480 of FIG. 4). For example, as illustrated, it may be designed such that a B2-pin is electrically coupled with the conductive exterior member (e.g., 480 of FIG. 4), which may correspond to the pin 492 of FIG. 4. A plug (e.g., 1300 of FIG. 13A or FIG. 13B) of an external electronic device (e.g., 102 of FIG. 1) may be connected to the receptacle 1400, and the external electronic device may detect leakage current through the B2-pin with respect to at least one of ground pins A1, A12, B1, and B12 of a receptacle 1500.

Returning to FIG. 11D, the receptacle 1100 may have pins A and B arranged differently according to a type of providing it. According to some embodiments, the receptacle 1100 may be designed to further include additional pin(s) or omit part of pin(s). When a pin arrangement structure of the receptacle 1100 is changed, a pin arrangement structure of a plug (e.g., 1300 of FIG. 13A or FIG. 13B) may also be changed. In various embodiments, although not shown, the receptacle 1100 or the plug 1300 may be changed variously according to a convergence trend of a digital device.

According to various embodiments, the receptacle 1100 is not limited to the aforementioned USB type-C connector, but may be various such as a USB type-A connector, a USB type-B connector, a USB type mini-A connector, a USB type mini-B connector, a USB type mini-C connector, or the like. According to an embodiment, in the connector, at least one pin not used in communication through a corresponding USB protocol may be configured as the pin 492 of FIG. 4.

Figure 16A:
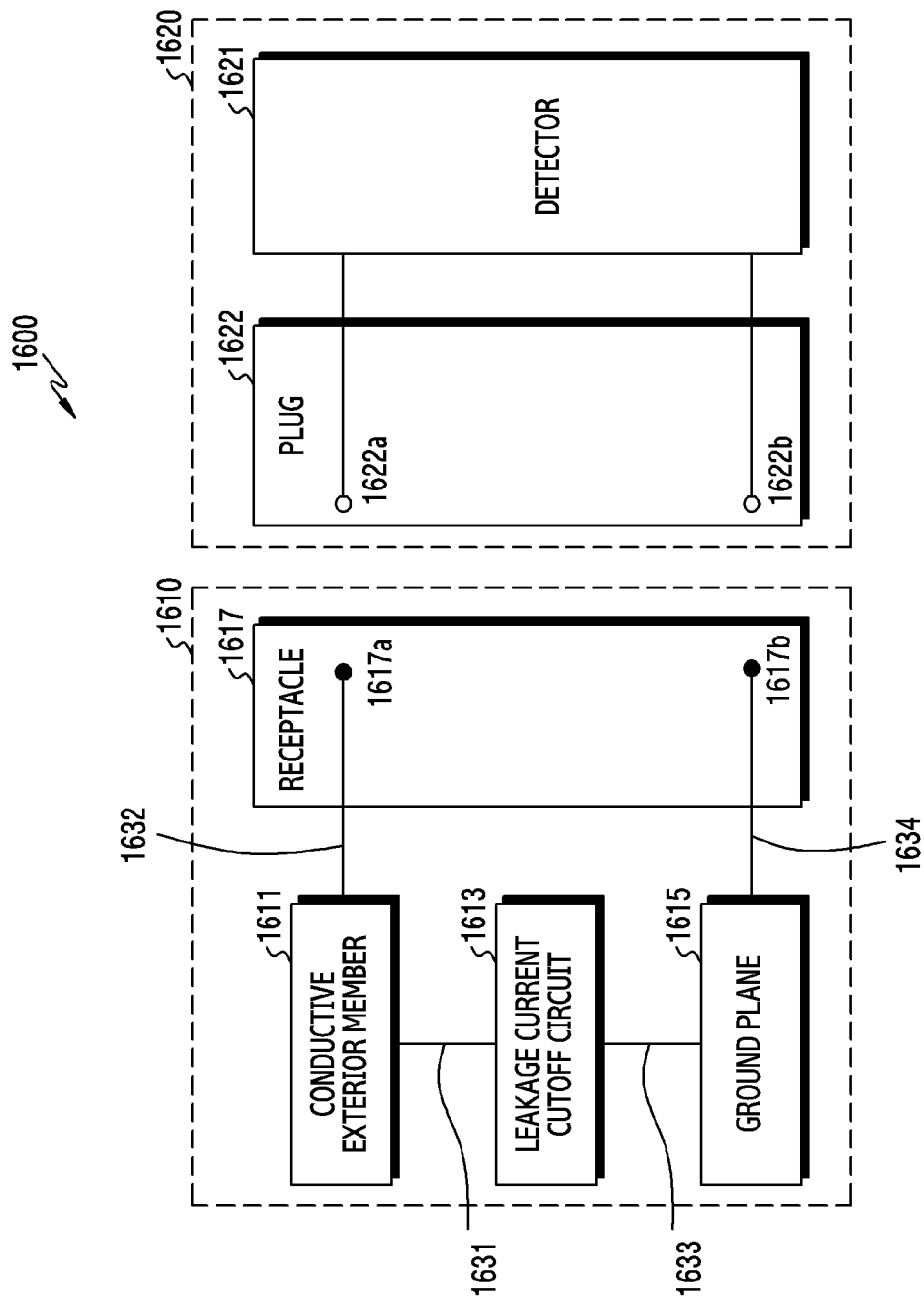
FIG. 16A is a block diagram of a system for leakage current detection according to an embodiment.
Figure 16B:
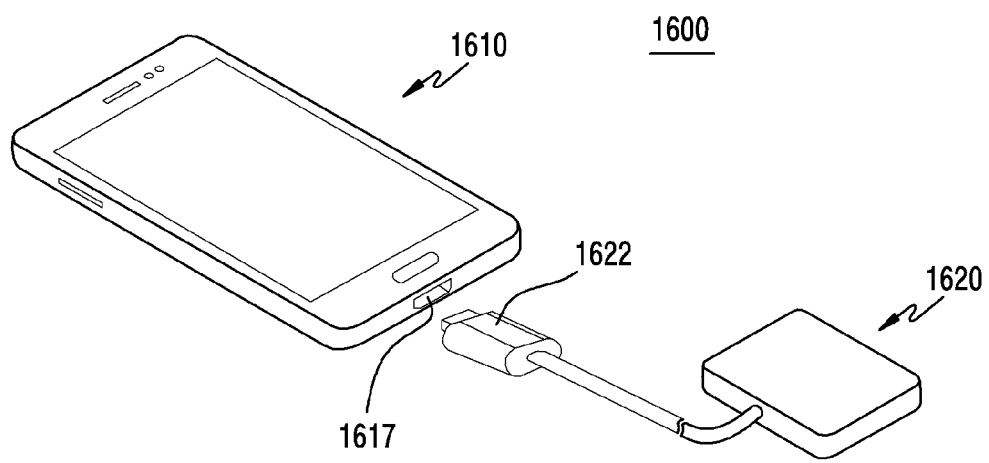
FIG. 16B illustrates a system for leakage current detection according to an embodiment.

FIG. 16A is a block diagram of a system for leakage current detection according to an embodiment. FIG. 16B illustrates a system for leakage current detection according to an embodiment. Referring to FIG. 16A and FIG. 16B, a system 1600 may include an electronic device 1610 and an external electronic device 1620. For example, the electronic device 1610 may include at least part of the electronic device 101 of FIG. 1, the electronic device 200 of FIG. 2A, the electronic device 300 of FIG. 3, or the electronic device 400 of FIG. 4. The external electronic device 1620 may be the external electronic device 102 of FIG. 1.

Referring to FIG. 16A, according to an embodiment, the electronic device 1610 may include a conductive exterior member 1611, a leakage current cutoff circuit 1613, a ground plane 1615, and a receptacle 1617. In an embodiment, the conductive exterior member 1611, the leakage current cutoff circuit 1613, the ground plane 1615, and the receptacle 1617 may be respectively similar or equal to the conductive exterior member 480, leakage current cutoff circuit 442, ground plane 441, and connector 490 of FIG. 4.

According to an embodiment, the electronic device 1610 may include a first conductive path 1631 (e.g., 401 of FIG. 4) electrically coupling the conductive exterior member 1611 and the leakage current cutoff circuit 1613. The electronic device 1610 may include a second conductive path 1632 (e.g., 402 of FIG. 4) electrically coupling the conductive exterior member 1611 and at least one pin 1617a (e.g., 492 of FIG. 4) of the receptacle 1617. The electronic device 1610 may include a third conductive path 1633 electrically coupling the leakage current cutoff circuit 1613 and the ground plane 1615. The electronic device 1610 may include a fourth conductive path 1634 (e.g., the third conductive path 403 of FIG. 4) electrically coupling the ground plane 1615 and at least one pin 1617b (e.g., 491 of FIG. 4) of the receptacle 1617.

According to an embodiment, the external electronic device 1620 (e.g., 102 of FIG. 1) may include a detector 1621 and a plug 1622 (e.g., 1300 of FIG. 13A). When the plug 1622 of the external electronic device 1620 is connected to the receptacle 1617, corresponding pins 1622a and 1622b of the plug 1622 may be electrically coupled with the pins 1617a and 1617b of the receptacle 1617. The detector 1621 may detect leakage current through the pins 1617a and 1617b of the receptacle 1617. The detector 1621 may detect whether leakage current cutoff performance of the electronic device 1610 deteriorates, based on current leaked from the receptacle 1617 of the electronic device 1610.

Figure 17:
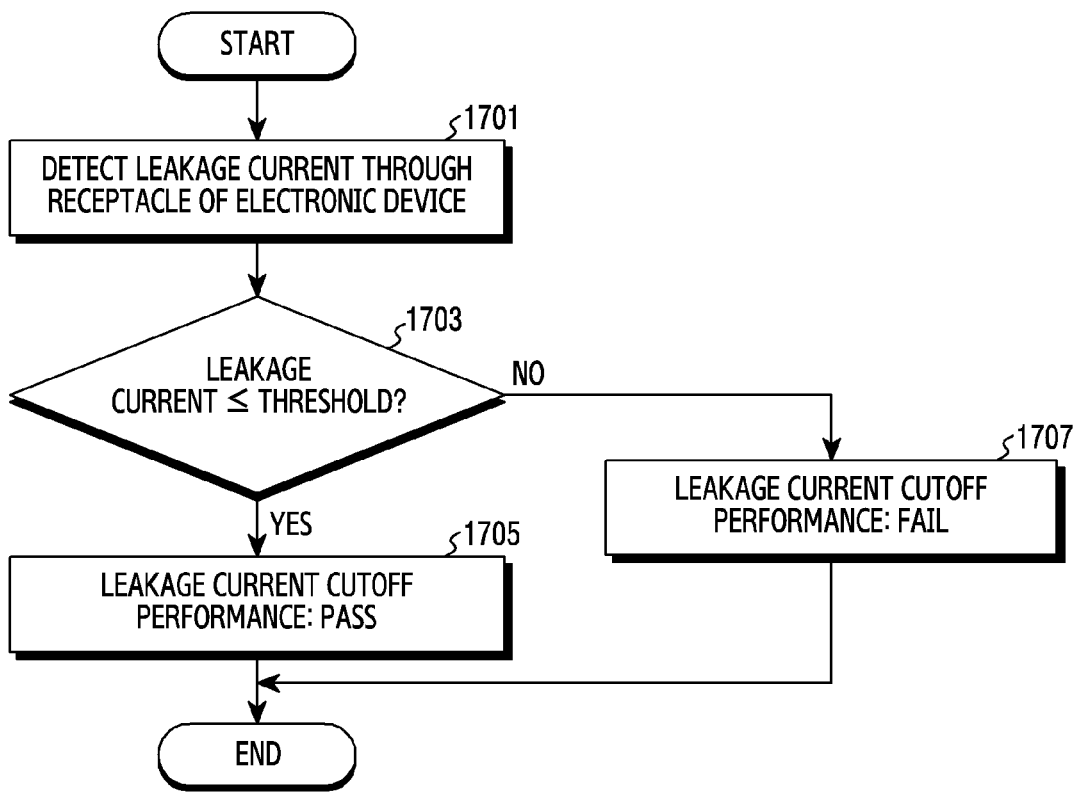
FIG. 17 illustrates an operational flow of an external electronic device according to an embodiment.

FIG. 17 illustrates an operational flow of an external electronic device according to an embodiment.

Referring to FIG. 17, in operation 1701, an external electronic device (e.g., 102 of FIG. 1 or 1620 of FIG. 16A) may detect leakage current through a receptacle (e.g., 1617 of FIG. 16A) of an electronic device (e.g., 1610 of FIG. 16A).

According to an embodiment, in operation 1703, the external electronic device may compare the detected leakage current with a threshold.

According to an embodiment, if the detected leakage current is less than or equal to the threshold, in operation 1705, the external electronic device may recognize that leakage current cutoff performance of the electronic device is in a normal state.

According to an embodiment, if the detected leakage current is greater than the threshold, in operation 1707, the external electronic device may recognize that the leakage current cutoff performance of the electronic device is in an abnormal state. According to an embodiment, if there is a breakage in a leakage current cutoff circuit (e.g., 1613 of FIG. 16A), the leakage current cutoff performance may be in the abnormal state. If the leakage current cutoff performance is in the abnormal state, it may be difficult to cut off current leaked to a conductive exterior member (e.g., 1611 of FIG. 16A). According to various embodiments, upon detecting the deterioration of the leakage current cutoff performance of an electronic device (e.g., 1610 of FIG. 16A), the external electronic device may provide various outputs (e.g., a sound, an image, a vibration, etc.) regarding this. For example, upon detecting the deterioration in the leakage current cutoff performance of the electronic device 1610, the external electronic device may output a set beep sound.

Figure 18:
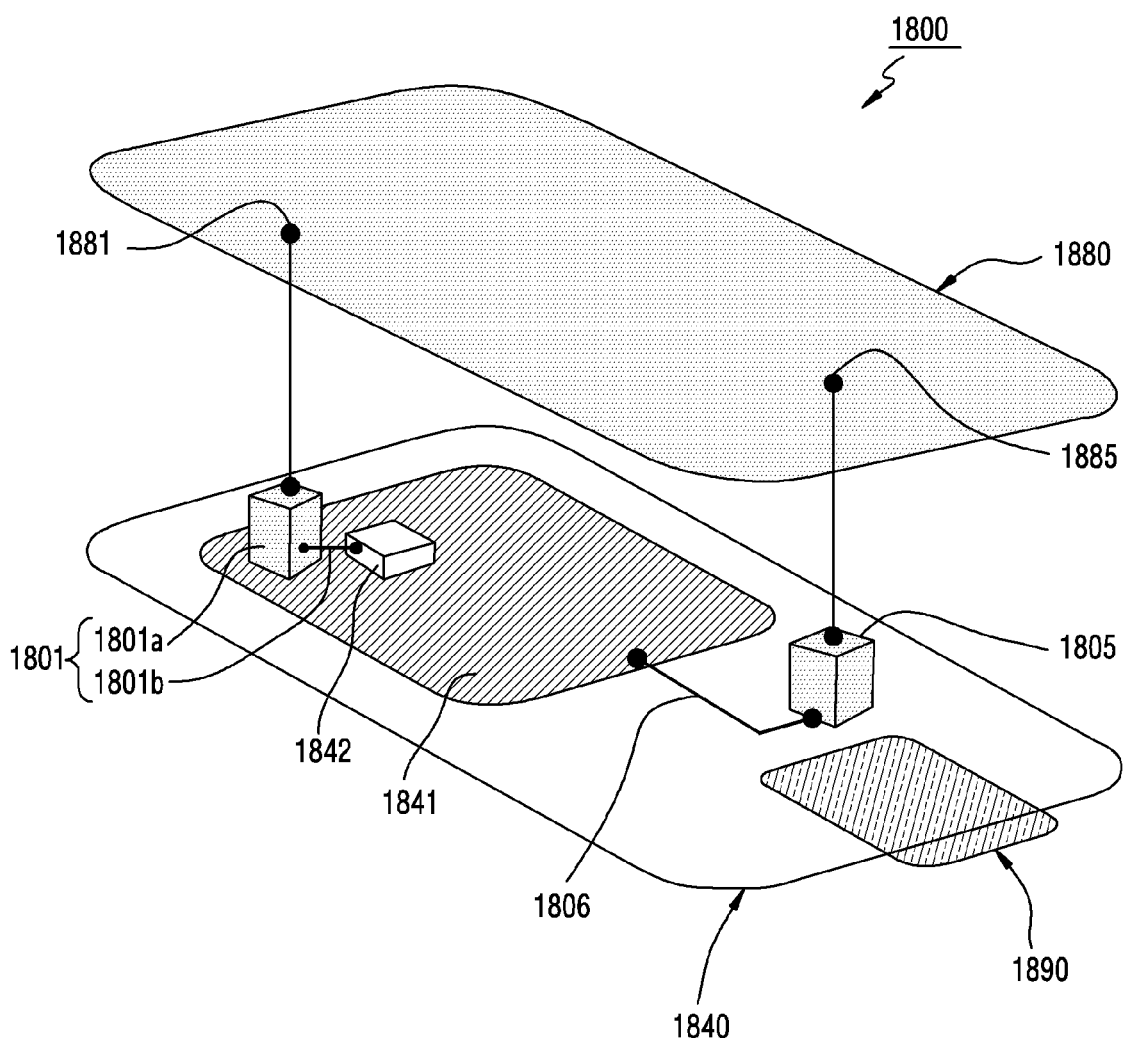
FIG. 18 illustrates an electronic device including a conductive exterior member and a leakage current cutoff circuit according to various embodiments.

FIG. 18 illustrates an electronic device including a conductive exterior member and a leakage current cutoff circuit according to various embodiments. For example, an electronic device 1800 of FIG. 18 may include at least part of the electronic device 101 of FIG. 1, the electronic device 200 of FIG. 2A, and the electronic device 300 of FIG. 3.

Referring to FIG. 18, according to an embodiment, the electronic device 1800 may include a PCB 1840 (e.g., the PCB 340 of FIG. 3), a conductive exterior member 1880 (e.g., the back plate 380 of FIG. 3), and a connector 1890. The PCB 1840 may include a ground plane 1841. A leakage current cutoff circuit 1842 may be electrically coupled with the ground plane 1841 of the PCB 1840. According to various embodiments, the leakage current cutoff circuit 1842 may be mounted on the ground plane 1841 of the PCB 1840.

According to an embodiment, the leakage current cutoff circuit 1842 may be electrically coupled with the conductive exterior member 1880. The leakage current cutoff circuit 1842 may decrease or cut off leakage current which flows from the ground plane 1841 of the PCB 1840 to the conductive exterior member 1880. According to various embodiments, the leakage current cutoff circuit 1842 may be similar or identical to the leakage current cutoff circuit 442 of FIG. 4, and descriptions thereof will be omitted.

According to an embodiment, the electronic device 1800 may include a conductive path 1801 electrically coupling the leakage current cutoff circuit 1842 and a first point 1881 of the conductive exterior member 1880. The conductive path 1801 may include a first contact 1801*a* electrically coupling the leakage current cutoff circuit 1842. The conductive path 1801 may include a line 1801*b* electrically coupling the first contact 1801*a* and the leakage current cutoff circuit 1842. According to various embodiments, the conductive path 1801 may be similar or identical to the first conductive path 401 of FIG. 4, and detailed descriptions thereof will be omitted.

The electronic device 1800 may include, for example, a power management circuit 1805 (e.g., the power management module 188 of FIG. 1). According to an embodiment, the power management circuit 1805 may include a PMIC mounted on the PCB 1840. The power management circuit 1805 may be electrically coupled to the ground plane 1841 via a line (or a conductive pattern) 1806. The power management circuit 1805 may be electrically coupled with the conductive exterior member 1880. According to an embodiment, the electronic device 1800 may include a fifth contact (not shown) electrically coupled with the power management circuit 1805. The fifth contact may be mounted on the PCB 1840, and may be electrically coupled with the fifth point 1885 of the conductive exterior member 1880. According to various embodiments, the fifth contact may include a flexible member such as a C-clip, a pogo-pin, a spring, a conductive poron and rubber, a conductive tape, a cooper connector, or the like.

According to an embodiment, the power management circuit 1805 may detect leakage current which flows from the ground plane 1841 to the conductive exterior member 1880. For example, if there is a deterioration in leakage current cutoff performance (e.g., a breakage in the leakage current cutoff circuit 1842), the leakage current may flow from the ground plane 1841 to the conductive exterior member 1880, which may be detected by the power management circuit 1805. The power management circuit 1805 may provide a processor (e.g., 120 of FIG. 1) with a magnitude of leakage current which flows from the ground plane 1841 to the conductive exterior member 1880.

According to an embodiment, the processor may display the magnitude of the leakage current, obtained from the power management circuit 1805, via a display (e.g., the display device 160 of FIG. 1). For another example, the processor may transmit the magnitude of the leakage current to an external electronic device (or an external test device) (e.g., 102 of FIG. 1) connected to the connector 1890. In some embodiments, the processor may transmit the magnitude of the leakage current to the external electronic device (e.g., 104 or 108 of FIG. 1) via a wireless communication module (e.g., 192 of FIG. 1). The external electronic device (e.g., the external test device) may detect leakage current cutoff performance of the electronic device 1800 on the basis of the magnitude of leakage current transmitted from the electronic device 1800.

In some embodiments, although not shown, the electronic device 1800 of FIG. 18 may be designed to further include the second conductive path 402 of FIG. 4.

Figure 19:
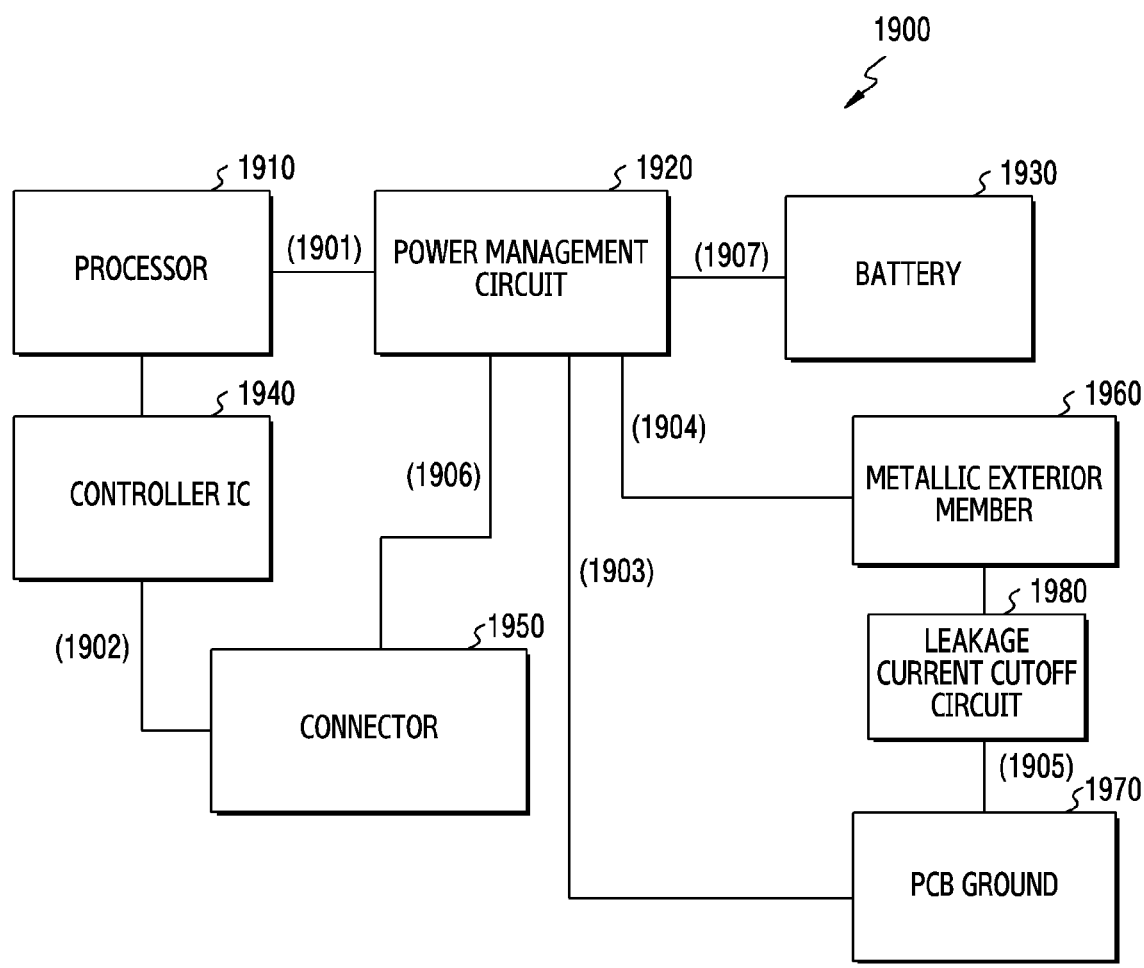
FIG. 19 is a block diagram of an electronic device according to various embodiments.

FIG. 19 is a block diagram of an electronic device according to various embodiments. According to various embodiments, an electronic device 1900 may include at least part of the electronic device 101 of FIG. 1, the electronic device 200 of FIG. 2A, the electronic device 300 of FIG. 3, or the electronic device 1800 of FIG. 18.

Referring to FIG. 19, in an embodiment, the electronic device 1900 may include a processor 1910, a power management circuit 1920, a battery 1930, a connector 1950, a metallic exterior member 1960, a PCB ground 1970, and a leakage current cutoff circuit 1980.

According to an embodiment, the processor 1910 (e.g., the processor 120 of FIG. 1) may be electrically coupled with the power management circuit 1920 via a first line 1901, and may be electrically coupled with the connector 1950 (e.g., a USB connector) via a second line 1902. According to various embodiments, the connector 1950 may include the connecting terminal 178 of FIG. 1, the connector hole 2271 of FIG. 2A, or the connector 1890 of FIG. 18.

According to an embodiment, the power management circuit 1902 may be electrically coupled with the PCB 1970 (e.g., the ground plane 1841 of FIG. 18) via a third line 1903. The power management circuit 1920 may be electrically coupled with a metallic exterior member (e.g., 1880 of FIG. 18) via a fourth line 1904. The power management circuit 1920 may be electrically coupled with the connector 1950 via a sixth line 1906. The power management circuit 1920 may be electrically coupled with a battery 1930 via a seventh line 1907. According to various embodiments, the power management circuit 1920 may be the power management module 199 of FIG. 1 or the power management circuit 1805 of FIG. 18. For example, the power management circuit 1920 may distribute power for driving elements (e.g., the processor 1910, the connector 1950, etc.) by using power of the battery 1930 provided via the seventh line 1907. For example, power from an external electronic device (e.g., a charging device) connected to the connector 1950 may be provided to the power management circuit 1920 via the sixth line 1906. The power management circuit 1920 may provide the battery 1930 with power supplied from the external electronic device via the seventh line 1907 (e.g., battery charging). In some embodiments, although not shown, the power management circuit 1920 may receive wireless power via a wireless charging module of the electronic device 1900, and may provide the battery 1930 with the received wireless power via the seventh line 1907 (e.g., wireless charging of the battery).

According to an embodiment, the leakage current cutoff circuit 1980 may be mounted on the fifth line 1905 which electrically couples between the metallic exterior member 1960 and the PCB ground 1970. According to various embodiments, the leakage current cutoff circuit 1980 may decrease or cut off leakage current which flows from the PCB ground 1970 to the conductive exterior member 1960. According to various embodiments, the leakage current cutoff circuit 1980 may be similar or identical to the leakage current cutoff circuit 442 of FIG. 4, and descriptions thereof will be omitted. In some embodiments, the power management circuit 1920 may be designed to include the leakage current cutoff circuit 1980.

According to an embodiment, the power management circuit 1920 (e.g., 1805 in FIG. 18) may detect leakage current which flows from the PCB ground 1970 to the conductive exterior member 1960. For example, if there is a deterioration in leakage current cutoff performance (e.g., a breakage in the leakage current cutoff circuit 1980), the leakage current may flow from the PCB ground 1970 to the conductive exterior member 1960, which may be detected by the power management circuit 1920. The power management circuit 1920 may provide the processor 1910 with a magnitude of leakage current which flows from the PCB ground 1970 to the conductive exterior member 1960 via the first line (or the first data line) 1901.

According to an embodiment, the processor 1910 may display the magnitude of the leakage current obtained from the power management circuit 1920 via a display (not shown) (e.g., the display device 160 of FIG. 1). For another example, the processor 1910 may transmit the magnitude of the leakage current to an external electronic device (or an external test device) (e.g., 102 of FIG. 1) connected to the connector 1950 via the second line (or the second data line) 1902. According to an embodiment, the electronic device 1900 may include a controller IC 1940 (e.g., a Channel Configuration (CC) IC) mounted on the second line 1902. The magnitude of the leakage current may be transmitted to the external electronic device connected to the connector 1950 via the controller IC 1940. In some embodiments, although not shown, the processor 1910 may transmit the magnitude of the leakage current to the external electronic device via the wireless communication module (e.g., 192 of FIG. 1) of the electronic device 1900. The external electronic device (e.g., the external test device) may detect leakage current cutoff performance of the electronic device 1900 on the basis of the magnitude of the leakage current transmitted from the electronic device 1900.

According to some embodiments, the power management circuit 1920 may provide the processor 1910 with information including the magnitude of the leakage current which flows from the PCB ground 1970 to the conductive exterior member 1960. If the magnitude of the leakage current obtained from the power management circuit 1920 is less than or equal to a threshold, the processor 1910 may determine that leakage current cutoff performance of the electronic device 1900 is in a normal state. If the magnitude of the leakage current obtained from the power management circuit 1920 is greater than the threshold, the processor 1910 may determine that the leakage current cutoff performance of the electronic device 1900 is in an abnormal state.

According to some embodiments, if the leakage current which flows from the PCB ground 1970 to the conductive exterior member 1960 is less than or equal to the threshold, the power management circuit 1920 may provide the processor 1910 with a first signal related thereto. The processor 1910 may recognize that the leakage current cutoff performance of the electronic device 1900 is in the normal state on the basis of the first signal. If the leakage current which flows from the PCB ground 1970 to the conductive exterior member 1960 is greater than the threshold, the power management circuit 1920 may provide the processor 1910 with a second signal related thereto. The processor 1910 may recognize that the leakage current cutoff performance of the electronic device 1900 is in the abnormal state on the basis of the second signal.

According to various embodiments, upon identifying the abnormal state of the leakage current cutoff performance, the processor 1910 may display the abnormal state of the leakage current cutoff performance via a display (e.g., the display device 160 of FIG. 1). For another example, the processor 1910 may transmit the abnormal state of the leakage current cutoff performance to an external electronic device (or an external test device) (e.g., 102 of FIG. 1) connected to the connector 1950. In some embodiments, the processor may transmit the abnormal state of the leakage current cutoff performance to an external electronic device (e.g., 104 or 108 of FIG. 1) via a wireless communication module (e.g., 192 of FIG. 1).

According to some embodiments, leakage current detection using the power management circuit 1920 may be carried out during a process of producing the electronic device 1900.

Figure 20:
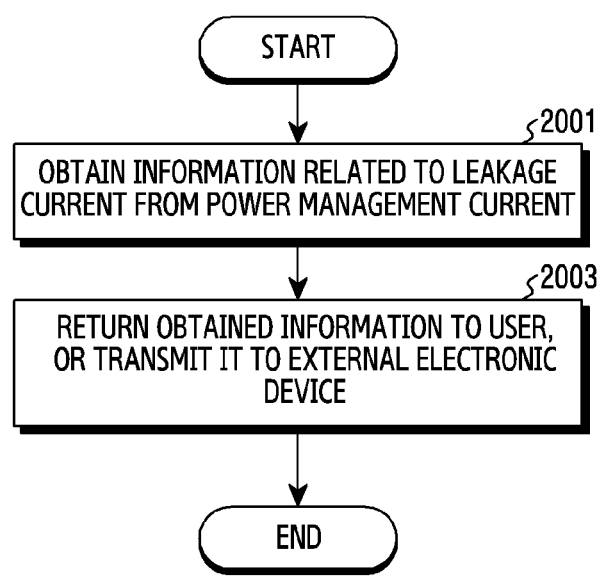
FIG. 20 illustrates an operational flow of an electronic device according to various embodiments.

FIG. 20 illustrates an operational flow of an electronic device according to various embodiments. According to various embodiments, the electronic device may include at least part of the electronic device 101 of FIG. 1, the electronic device 200 of FIG. 2A, the electronic device 300 of FIG. 3, the electronic device 1800 of FIG. 18, or the electronic device 1900 of FIG. 19.

Referring to FIG. 20, according to an embodiment, in operation 2001, a processor (e.g., 120 of FIG. 1 or 1910 of FIG. 19) (hereinafter, 1910 of FIG. 19) of the electronic device may obtain information related to leakage current from a power management circuit (e.g., 1920 of FIG. 19). For example, returning to FIG. 19, the information related to leakage current may be a magnitude of leakage current which flows from the PCB ground 1970 to the metallic exterior member 1960.

According to an embodiment, in operation 2003, the processor 1910 may return the obtained information related to leakage current to a user. According to an embodiment, the processor 1910 may output the magnitude of the leakage current via a display (e.g., the display device 160 of FIG. 1). In some embodiments, the processor 1910 may provide the magnitude of the leakage current by using an output (e.g., a set beep sound) via the audio module 170 of FIG. 1, an output (e.g., a set vibration) via the haptic module 179, or the like.

According to some embodiments, in operation 2003, the processor 1910 may transmit the obtained information related to the leakage current to an external electronic device. For example, the processor 1910 may transmit the magnitude of the leakage current to the external electronic device connected to a connector (e.g., 1950 of FIG. 19). The external electronic device (e.g., the external test device) may detect leakage current cutoff performance of the electronic device 1800 on the basis of the magnitude of the leakage current transmitted from the electronic device 1800.

According to an embodiment of the disclosure, an electronic device (e.g., 200 of FIG. 2A or FIG. 2B) may include a housing (e.g., 210 of FIG. 2A) including a front plate (e.g., 201 of FIG. 2A), a back plate (e.g., 202 of FIG. 2B or the metallic exterior member 480 of FIG. 4)) disposed to the opposite side of the front plate, and a side member (e.g., 203 of FIG. 2A or the side bezel structure of FIG. 3) surrounding a space between the front plate and the back plate. At least a part of the back plate 202 may be constructed of a conductive material, and the side member 203 may include an opening (e.g., the connector hole 2271 of FIG. 2A or FIG. 2B, or 3101 of FIG. 3). The electronic device 200 may include a touch screen display (e.g., the display 221 of FIG. 2A) disposed between the front plate 201 and the back plate 202. The electronic device 200 may include a female connector (e.g., 490 of FIG. 4) disposed inside the opening 2271, constructed to house an external male connector, and including a plurality of pins. The electronic device 200 may include a Printed Circuit Board (PCB) (e.g., 440 of FIG. 4) disposed inside the space and including a ground plane (e.g., 441 of FIG. 4). The electronic device 200 may include a circuit (e.g., the leakage current cutoff circuit 442 of FIG. 4) electrically coupled to the ground plane 441 and/or mounted thereon to cut off leak current from the PCB 440. The electronic device 200 may include a first conductive path (e.g., 401 of FIG. 4) constructed between the circuit 442 and a first point (e.g., 481 of FIG. 4) of at least part of the back plate 202. The electronic device 200 may include a second conductive path (e.g., 402 of FIG. 4) constructed between at least one of the pins (e.g., 1130 of FIG. 11A) and a second point (e.g., 482 of FIG. 4) of at least part of the back plate 202.

According to an embodiment of the disclosure, at least one of the first conductive path 401 and the second conductive path 402 may include a flexible conductive member (e.g., 401a or 401b of FIG. 4) disposed between the PCB 440 and the back plate 202.

According to an embodiment of the disclosure, the flexible conductive member may include at least one of a C-clip, a pogo-pin, a spring, a conductive poron and rubber, a conductive tape, and a cooper connector.

According to an embodiment of the disclosure, the second conductive path 402 may include a contact (e.g., 1043 of FIG. 10) included in the PCB 220, a flexible conductive member (e.g., the second contact 402a of FIG. 4) disposed between the contact 1043 and the second point 482, and a conductive pattern (e.g., 1044 of FIG. 10) included in the PCB 440 and coupling the contact 1043 and the at least one pin 492.

According to an embodiment of the disclosure, end portions (e.g., the tails 11304 of FIG. 11C) of the plurality of pins may be joined with pads (e.g., the lands 1203 of FIG. 12) constructed to an outer face of the PCB. At least part of the conductive pattern (e.g., 1044 of FIG. 10) may be disposed inside the PCB.

According to an embodiment of the disclosure, the female connector (e.g., 990 of FIG. 9) may be mounted on the PCB 942 of FIG. 9), and the contact (e.g., 902a of FIG. 9) may be disposed within 20 mm from the female connector 990.

According to an embodiment of the disclosure, the PCB may include a first PCB (e.g., 941 of FIG. 9) and second PCB (e.g., 942 of FIG. 9) physically separated from each other, and a Flexible Printed Circuit Board (FPCB) (e.g., 943 of FIG. 9) electrically coupling the first PCB 941 and the second PCB 942. The female connector 990 may be mounted on the first PCB 941 or the second PCB 942.

According to an embodiment of the disclosure, the electronic device may further include a contact (e.g., 1043 of FIG. 10) on the PCB electrically coupled with the second point (e.g., 482 of FIG. 4), and both the contact 1043 and the female connector (e.g., 990 of FIG. 9) may be mounted on one of the first PCB 941 and the second PCB 942.

According to an embodiment of the disclosure, the circuit (e.g., the leakage current cutoff circuit 442 of FIG. 4) may include a Power Management Integrated Circuit (PMIC).

According to an embodiment of the disclosure, the female connector may include a Universal Serial Bus (USB) 2.0 connector. The at least one pin may be a pin configured as a pin not used in communication through a USB 2.0 protocol.

According to an embodiment of the disclosure, the female connector may include a USB type-C connector. The at least one pin may be configured as a pin (e.g., A2, A3, A10, A11, B2, B3, B10, or B11 of FIG. 11D) not used in communication through a USB protocol.

According to an embodiment of the disclosure, the female connector may include a USB type-C connector. The at least one pin may be constructed at a portion (e.g., 112031 of FIG. 11C) which is snap-fit engaged with a hook (e.g., 13203 of FIG. 13C) included in the male connector.

According to an embodiment of the disclosure, the female connector may include a shell (e.g., 1110 of FIG. 11B) aligned with the opening (e.g., 2271 of FIG. 2A) and including a tongue (e.g., 1120 of FIG. 11B) disposed to a space of the shell. The at least one pin may be constructed by a conductive portion (e.g., a mid-plate) included in the tongue.

According to an embodiment of the disclosure, the first conductive path (e.g., 401 of FIG. 4) may include at least part of the circuit (e.g., the leakage current cutoff circuit 442 of FIG. 4).

According to an embodiment of the disclosure, the back plate (e.g., 201 of FIG. 2A) and the side member (e.g., 203 of FIG. 2A) may be constructed of an integral conductive material.

According to an embodiment of the disclosure, an electronic device (e.g., 1800 of FIG. 18) may include a housing (e.g., 210 of FIG. 2A) including a front plate (e.g., 201 of FIG. 2A), a back plate (e.g., 202 of FIG. 2B or 1880 of FIG. 18) disposed to the opposite side of the front plate 201, and a side member (e.g., 203 of FIG. 2A) surrounding a space between the front plate 201 and the back plate 202. At least a part of the back plate 202 may be constructed of a conductive material, and the side member 203 may include an opening (e.g., the connector hole 2271 of FIG. 2A, or 3101 of FIG. 3). The electronic device 1800 may further include a touch screen display (e.g., the display 221 of FIG. 2A) disposed between the front plate 201 and the back plate 202. The electronic device 1800 may include a PCB (e.g., 1840 of FIG. 18) disposed inside the space and including a ground plane (e.g., 1841 of FIG. 18). The electronic device 1800 may include a first circuit (e.g., the leakage current cutoff circuit 1842 of FIG. 18) electrically coupled to the ground plane 1841 and/or mounted thereon to cut off leak current from the PCB 1840. The electronic device 1800 may include a conductive path (e.g., 1801 of FIG. 18) constructed between the first circuit 1842 and a first point (e.g., 1881 of FIG. 18) of at least part of the back plate (e.g., 1880 of FIG. 18). The electronic device 1800 may include a second circuit (e.g., the power management circuit 1805 of FIG. 18) electrically coupled with the ground plane 1841 and a second point (e.g., 1885 of FIG. 18) of at least part of the back plate 1880 to detect leakage current which flows from the PCB 1840 to the back plate 1880. The electronic device 1800 may include a female connector (e.g., 1890 of FIG. 18) disposed inside the opening 2271, constructed to house an external male connector, and including a plurality of pins. The electronic device 1800 may include a processor (e.g., 1910 of FIG. 19) electrically coupled with the second circuit and the female connector 1890. The processor 1910 may transmit intensity of leakage current detected by the second circuit 1805 to the male connector connected to the female connector 1890.

According to various embodiments of the disclosure, the second circuit (e.g., the power management circuit 1805 of FIG. 18) may include a PMIC electrically coupled with a battery (e.g., 1930 of FIG. 19) mounted on the electronic device 1800.

According to various embodiments of the disclosure, the processor (e.g., 1910 of FIG. 19) may display intensity of leakage current detected by the second circuit (e.g., the power management circuit 1805 of FIG. 18) via a display (e.g., the display device 160 of FIG. 1) mounted on the electronic device 1800.

According to various embodiments, the conductive path (e.g., 1801 of FIG. 18) may include a flexible conductive member disposed between the PCB 1840 and the back plate 1880.

In another embodiment of the disclosure, referring to FIG. 4, a method of detecting leakage current cutoff performance for the electronic device 400 having the conductive exterior member 480 may include detecting current leaked through the USB connector 490 of the electronic device 400. The method may include recognizing that performance for cutting off current leaked to the conductive exterior member 480 is in a deterioration state if the detected current exceeds a threshold.

Meanwhile, the aforementioned embodiments of the disclosure may be writable as a program executable in a computer, and may be implemented in a general purpose digital computer for operating the program by using a computer-readable recording medium. In addition, a data structure used in the aforementioned embodiment of the disclosure may be recorded in the computer-readable recording medium through several means. The computer-readable recording medium includes a storage medium such as a magnetic medium (e.g., a Read Only Memory (ROM), a floppy disc, a hard disc, etc.) and an optical storage medium (e.g., a Compact Disc-ROM (CD-ROM), a Digital Versatile Disc (DVD), etc.).

While the disclosure has been shown and described with reference to certain embodiments thereof, it will be understood by those skilled in the art that various changes in form and details may be made therein without departing from the spirit and scope of the disclosure as defined by the appended claims and their equivalents. Therefore, it shall be considered that the disclosed embodiments are provided not for a restrictive purpose but for an illustrative purpose. The scope of the disclosure is defined not by the detailed description of the disclosure but by the appended claims and their equivalents, and all differences within the scope will be construed as being included in the disclosure.

The invention claimed is:

1. An electronic device comprising:
    a housing including a front plate, a back plate disposed to the opposite side of the front plate, and a side member surrounding a space between the front plate and the back plate, wherein at least a part of the back plate is constructed of a conductive material, and the side member includes an opening;
    a touch screen display disposed between the front plate and the back plate;
    a female connector disposed inside the opening, constructed to house an external male connector, and including a plurality of pins;
    a Printed Circuit Board (PCB) disposed inside the space and including a ground plane;
    a circuit electrically coupled to the ground plane and/or mounted thereon to cut off leak current from the PCB;
    a first conductive path constructed between the circuit and a first point of at least part of the back plate; and
    a second conductive path constructed between at least one of the pins and a second point of at least part of the back plate.

2. The electronic device of claim 1, wherein at least one of the first conductive path and the second conductive path includes a flexible conductive member disposed between the PCB and the back plate.

3. The electronic device of claim 2, wherein the flexible conductive member includes at least one of a C-clip, a pogo-pin, a spring, a conductive poron and rubber, a conductive tape, and a cooper connector.

4. The electronic device of claim 1, wherein the second conductive path includes:
    a contact included in the PCB;
    a flexible conductive member disposed between the contact and the second point; and
    a conductive pattern included in the PCB and coupling the contact and the at least one pin.

5. The electronic device of claim 4,
    wherein the female connector is mounted on the PCB, and
    wherein the contact is disposed within 20 mm from the female connector.

6. The electronic device of claim 1,
    wherein the PCB includes a first PCB and second PCB physically separated from each other, and a Flexible Printed Circuit Board (FPCB) electrically coupling the first PCB and the second PCB, and
    wherein the female connector is mounted on the first PCB or the second PCB.

7. The electronic device of claim 6, further comprising
    a contact on the PCB electrically coupled with the second point,
    wherein both the contact and the female connector are mounted on one of the first PCB and the second PCB.

8. The electronic device of claim 1, wherein the circuit includes a Power Management Integrated Circuit (PMIC).

9. The electronic device of claim 1, wherein the female connector includes a Universal Serial Bus (USB) 2.0 connector, and
    wherein the at least one pin is a pin configured as a pin not used in communication through a USB 2.0 protocol.

10. The electronic device of claim 1, wherein the female connector includes a USB type-C connector, and
    wherein the at least one pin is configured as a pin not used in communication through a USB protocol.

11. The electronic device of claim 1, wherein the female connector includes a USB type-C connector, and
    wherein the at least one pin is constructed at a portion which is snap-fit engaged with a hook included in the male connector.

12. The electronic device of claim 11, wherein the female connector includes a shell aligned with the opening and including a tongue disposed to a space of the shell, and wherein the at least one pin is constructed by a conductive portion included in the tongue.

13. The electronic device of claim 1, wherein the first conductive path includes at least part of the circuit.

14. The electronic device of claim 1, wherein the back plate and the side member are constructed of an integral conductive material.

15. A method of detecting leakage current cutoff performance for an electronic device having a conductive exterior member, the method comprising:
   detecting current leaked through a USB connector of the electronic device; and
   recognizing that performance for cutting off current leaked to the conductive exterior member is in a deterioration state if the detected current exceeds a threshold.

16. The electronic device of claim 4, wherein each end portion of the plurality of pins is coupled to pads formed on an outer face of the PCB, and
   wherein at least portion of the conductive pattern is disposed inside the PCB.

17. An electronic device comprising:
   a housing including a front plate, a back plate disposed opposite to the front plate, and a side member surrounding a space between the front plate and the back plate, wherein at least portion of the back plate is formed of a conductive material, and wherein the side member includes an opening;
   a touch screen display disposed between the front plate and the back plate;
   a printed circuit board (PCB) disposed inside the space and including a ground plane;
   a first circuit electrically connected to the ground plane to cut off leakage current from the PCB;
   a conductive path formed between the first circuit and a first point of the back plate;
   a second circuit electrically connected to the ground plane and a second point of the back plate to detect leakage current flowing from the PCB to the back plate;
   a female connector disposed in the opening and including a plurality of pins, the female connector configured to receive an external male connector; and
   a processor electrically connected to the second circuit and the female connector, the processor configured to transmit intensity of the leakage current detected by the second circuit to the external male connector connected to the female connector.

18. The electronic device of claim 17, the second circuit including a power management circuit (PMIC) electrically connected to a battery mounted on the electronic device.

19. The electronic device of claim 17, the processor configured to display the intensity of the leakage current detected by the second circuit via a display mounted on the electronic device.

20. The electronic device of claim 17, the conductive path including a flexible conductive member disposed between the PCB and the back plate.

* * * * *